(12) United States Patent
Ohsawa et al.

(10) Patent No.: US 9,928,891 B2
(45) Date of Patent: Mar. 27, 2018

(54) NONVOLATILE VARIABLE RESISTANCE MEMORY CIRCUIT WHICH INCLUDES MAGNETIC TUNNEL JUNCTION ELEMENT

(71) Applicant: TOHOKU UNIVERSITY, Sendai-shi (JP)

(72) Inventors: Takashi Ohsawa, Sendai (JP); Tetsuo Endoh, Sendai (JP)

(73) Assignee: Tohoku University, Miyagi (JP)

( * ) Notice: Subject to any disclaimer, the term of this patent is extended or adjusted under 35 U.S.C. 154(b) by 0 days.

(21) Appl. No.: 15/023,101

(22) PCT Filed: Sep. 18, 2014

(86) PCT No.: PCT/JP2014/074740
§ 371 (c)(1),
(2) Date: Mar. 18, 2016

(87) PCT Pub. No.: WO2015/041304
PCT Pub. Date: Mar. 26, 2015

(65) Prior Publication Data
US 2016/0225428 A1    Aug. 4, 2016

(30) Foreign Application Priority Data

Sep. 20, 2013  (JP) ................................. 2013-196202

(51) Int. Cl.
*G11C 5/08*        (2006.01)
*G11C 11/16*       (2006.01)
(Continued)

(52) U.S. Cl.
CPC ........ *G11C 11/1673* (2013.01); *G11C 11/161* (2013.01); *G11C 11/1659* (2013.01);
(Continued)

(58) Field of Classification Search
CPC ............ G11C 11/1673; G11C 11/1697; G11C 11/1659; G11C 11/161; G11C 14/0081;
(Continued)

(56) References Cited

U.S. PATENT DOCUMENTS 8,952,470 B2 *  2/2015  Lupino ................. H01L 27/224
                                                        257/421
2008/0219043 A1   9/2008  Yoon et al.
(Continued)

FOREIGN PATENT DOCUMENTS

JP    2010-520576    6/2010

OTHER PUBLICATIONS

Int'l. Search Report issued in Int'l. App. No. PCT/JP2014/074740, dated Nov. 25, 2014.
(Continued)

*Primary Examiner* — Mohammed A Bashar
(74) *Attorney, Agent, or Firm* — Greer Burns & Crain Ltd.

(57) ABSTRACT

One end of a current path of a second field-effect transistor is connected to a gate of a first field-effect transistor. One end of a magnetic tunnel junction element is connected to one end of a current path of the first field-effect transistor. A first control terminal is connected to another end of the current path of the first field-effect transistor. A second control terminal is connected to another end of the magnetic tunnel junction element. A third control terminal is connected to another end of the current path of the second field-effect transistor.

9 Claims, 24 Drawing Sheets

(51) Int. Cl.
*G11C 13/00* (2006.01)
*G11C 14/00* (2006.01)
(52) U.S. Cl.
CPC ...... *G11C 11/1675* (2013.01); *G11C 11/1697* (2013.01); *G11C 13/003* (2013.01); *G11C 14/0081* (2013.01); *G11C 2013/0071* (2013.01); *G11C 2213/74* (2013.01); *G11C 2213/79* (2013.01)
(58) Field of Classification Search
CPC .............. G11C 13/003; G11C 11/1675; G11C 2213/79; G11C 2213/74; G11C 2013/0071
See application file for complete search history.

(56) References Cited

U.S. PATENT DOCUMENTS

| 2008/0247222 | A1* | 10/2008 | Jung | G11C 11/16 365/158 |
| 2009/0073756 | A1* | 3/2009 | Yang | G11C 11/16 365/171 |
| 2009/0180315 | A1* | 7/2009 | Yoon | G11C 8/08 365/171 |

OTHER PUBLICATIONS

Ryu et al.; "IEEE Trans. VLSI Systems," vol. 20, No. 11, pp. 2044-2053; Nov. 2012.

\* cited by examiner

COMPARISON OF AREA BETWEEN
SELECTION DEVICES@90 nm

| Technology node [nm] | 90 | 65 | 45 | 32 |
|---|---|---|---|---|
| MTJ size [nmφ] | 100 | 70 | 50 | 35 |
| $R_P$ [kΩ] | 1.2 | 2.4 | 4.8 | 9.6 |
| $R_{AP}$ [kΩ] | 2.56 | 5.12 | 10.24 | 20.48 |
| Ic (AP→P) [μA] | 175 | 87 | 44 | 22 |
| Ic (P→AP) [μA] | 330 | 165 | 83 | 42 |
| $V_{dd}$ [V] | 1 | 1 | 0.9 | 0.8 |
| $L_g$ [nm] | 100 | 70 | 50 | 35 |

FIG. 18

| Technology node [nm] | MTJ φ [nm] | Wn1 [nm] | Wn2 [nm] | Wn1/MTJφ | Wn1/Wn2 |
|---|---|---|---|---|---|
| 90 | 100 | 850 | 200 | 8.5 | 4.3 |
| 65 | 70 | 500 | 160 | 7.1 | 3.1 |
| 45 | 50 | 400 | 130 | 8.0 | 3.1 |
| 32 | 35 | 400 | 100 | 11.4 | 4.0 |

NONVOLATILE FPGA CROSSBAR SWITCH

SWITCHING CELL

SWITCHING UNIT

NONVOLATILE VARIABLE RESISTANCE MEMORY CIRCUIT WHICH INCLUDES MAGNETIC TUNNEL JUNCTION ELEMENT

This is a National Phase Application filed under 35 U.S.C. § 371, of International Application No. PCT/JP2014/074740, filed Sep. 18, 2014.

TECHNICAL FIELD

The present disclosure relates to a memory circuit.

BACKGROUND ART

As a next generation nonvolatile memory realizing high speed performance and high levels of durability in rewriting, memories using magnetic tunnel junction (MTJ) elements, which are variable resistance memory elements, have drawn attention.

For using MTJ elements as the memory element, it is necessary to use a combination of an MTJ element and a selection device for selecting the MTJ element. As the selection device, N-type metal oxide semiconductor field-effect transistors (MOSFETs), P-type MOSFETs, complementary metal oxide semiconductors (CMOSs), and the like are used.

FIG. 23 shows the circuit configuration of a unit cell when the selection device is an N-type MOSFET 10a. Here, the bottom pin structure in which the N-type MOSFET 10a is connected to a pin layer 53 of an MTJ element 50 is used. A given voltage is applied to either one of a terminal 1 and a terminal 2 and the other terminal is grounded. As a voltage Von as a selection signal is applied to the gate of the N-type MOSFET 10a and the N-type MOSFET 10a is turned on, a current flows through the MTJ element 50 and data corresponding to the direction of the current flowing through the MTJ element 50 are written.

However, when the terminal 1 is grounded and a positive voltage is applied to the terminal 2, the N-type MOSFET 10a works in the saturation region; therefore, a current sufficient for rewriting the MTJ element 50 does not flow in the direction from the pin layer 53 to the free layer 51. Generally, a current that should flow from the pin layer 53 to the free layer 51 for switching the MTJ element from the parallel state to the antiparallel state is larger than a current that should flow from the free layer 51 to the pin layer 53 for switching from the antiparallel state to the parallel state. Therefore, the above situation is significantly disadvantageous from the viewpoint of the MTJ switching.

It is possible to use the top pin structure instead of the bottom pin structure. However, creating the top pin structure itself is difficult. Therefore, it is difficult to use the top pin structure both with the N-type MOSFET 10a and with a P-type MOSFET 10b.

FIG. 24 shows a circuit configuration when the selection device is a P-type MOSFET 10b. Here, the bottom pin structure is used. As the gate of the P-type MOSFET 10b is grounded and the gate of the P-type MOSFET 10b is turned on/off, a current is supplied/not supplied to the MTJ element 50.

However, when a terminal 3 is set to the ground potential, a terminal 2 is grounded, and a positive voltage is applied to a terminal 1, the P-type MOSFET 10b works in the saturation region. Therefore, a current sufficient for rewriting the stored data of the MTJ element 50 does not flow in the direction from the free layer 51 to the pin layer 53. In this situation, unlike the N-type MOSFET, the current necessary for switching the MTJ element and the current that can be flowed through the MOSFET well match in asymmetricity. However, a problem is that a P-type MOSFET is intrinsically low in the ability of current supply compared with an N-type MOSFET.

Moreover, as a case in which a CMOS is used as the selection device, Non-Patent Literature 1 discloses a nonvolatile flip-flop circuit including an MTJ element. Since a CMOS comprises a combination of an N-type MOSFET and a P-type MOSFET, it is possible to path a current symmetric in both directions through the MTJ element.

CITATION LIST

Non Patent Literature

Non-Patent Literature 1: K. Ryu et al., IEEE Trans. VLSI Systems, vol. 20, no. 11, pp. 2044-2053, November 2012.

SUMMARY OF INVENTION

Technical Problem

As described above, considering the individual nature of an N-type MOSFET, P-type MOSFET, and CMOS, the CMOS is presumably the most suitable for a selection device making it possible to flow a necessary current through a magnetic tunnel junction element in both directions. However, as described in the Non-Patent Literature 1, a COMS includes a total of two MOSFETs, an N-type MOSFET and a P-type MOSFET. Moreover, because wells have to be formed and so on, the CMOS cannot have a compact unit cell size, whereby problems are that the occupancy area is large and higher levels of integration is infeasible.

The present disclosure is made with the view of the above situations and an objective of the disclosure is to provide a memory circuit using a magnetic tunnel junction element that is compact and capable of flowing a writing current in both directions.

Solution to Problem

In order to achieve the above objective, the memory circuit of the present disclosure comprises:

a magnetic tunnel junction element, a first field-effect transistor, and a second field-effect transistor, wherein one end of a current path of the second field-effect transistor is connected to a gate of the first field-effect transistor, one end of the magnetic tunnel junction element is connected to one end of a current path of the first field-effect transistor, a first control terminal is connected to another end of the current path of the first field-effect transistor, a second control terminal is connected to another end of the magnetic tunnel junction element, and a third control terminal is connected to another end of the current path of the second field-effect transistor, and when specific voltages are applied to the first control terminal, the second control terminal, and the third control terminal, respectively, the current path of the first field-effect transistor reaches a steady state in which a specific current flows in a direction corresponding to the magnitude relation between the voltage applied to the first control terminal and the voltage applied to the second control terminal.

The memory circuit of the present disclosure may further comprise a selection circuit connected to the third control terminal and a read/write circuit connected to the first control terminal and the second control terminal. In such a case, a power supply voltage or a ground potential level voltage is applied to a gate of the second field-effect transistor, at a time of data writing in the magnetic tunnel junction element, the selection circuit applies the power supply voltage or ground potential level voltage to the third control terminal and the read/write circuit applies a voltage for flowing a writing current between the first control terminal and the second control terminal so as to set the magnetic tunnel junction element to either one of a low resistance state and a high resistance state, and at a time of data reading from the magnetic tunnel junction element, the selection circuit applies the power supply voltage or ground potential level voltage to the third control terminal and the read/write circuit directly or indirectly measures a resistance between the first control terminal and the second control terminal.

For example, the selection circuit applies the power supply voltage or ground potential level voltage to the third control terminal and subsequently the read/write circuit applies a voltage between the first control terminal and the second control terminal so as to cut off the second field-effect transistor.

The first field-effect transistor and second field-effect transistor each comprise, for example, an N-type MOSFET or a P-type MOSFET.

The first field-effect transistor and the second field-effect transistor are each, for example, of an element size of 90 nm or a later technology node generation, and the power supply voltage is 1.05V or lower.

For example, the first field-effect transistor and the second field-effect transistor are elements of 90 nm to 32 nm technology node generations.

It is desirable that a ratio between a channel width of the first field-effect transistor and a diameter of the magnetic tunnel junction element (Wn1/MTJφ) and a ratio between the channel width of the first field-effect transistor and a channel width of the second field-effect transistor (Wn1/Wn2) satisfy the following expression:

$$4 \leq Wn1/MTJ\varphi \leq 15, \ 2 \leq Wn1/Wn2 \leq 5.$$

Advantageous Effects of Invention

The present disclosure makes it possible to flow a necessary current through a magnetic tunnel junction element in both directions using a simplified and compact selection device.

BRIEF DESCRIPTION OF DRAWINGS

FIG. 18 is a chart showing the relationship between the MTJ scaling and the channel width of the selection elements in the technology nodes of 90 nm and smaller;

DESCRIPTION OF EMBODIMENTS

Embodiments of the present disclosure will be described hereafter with reference to the drawings.

Embodiment 1

Figure 1:
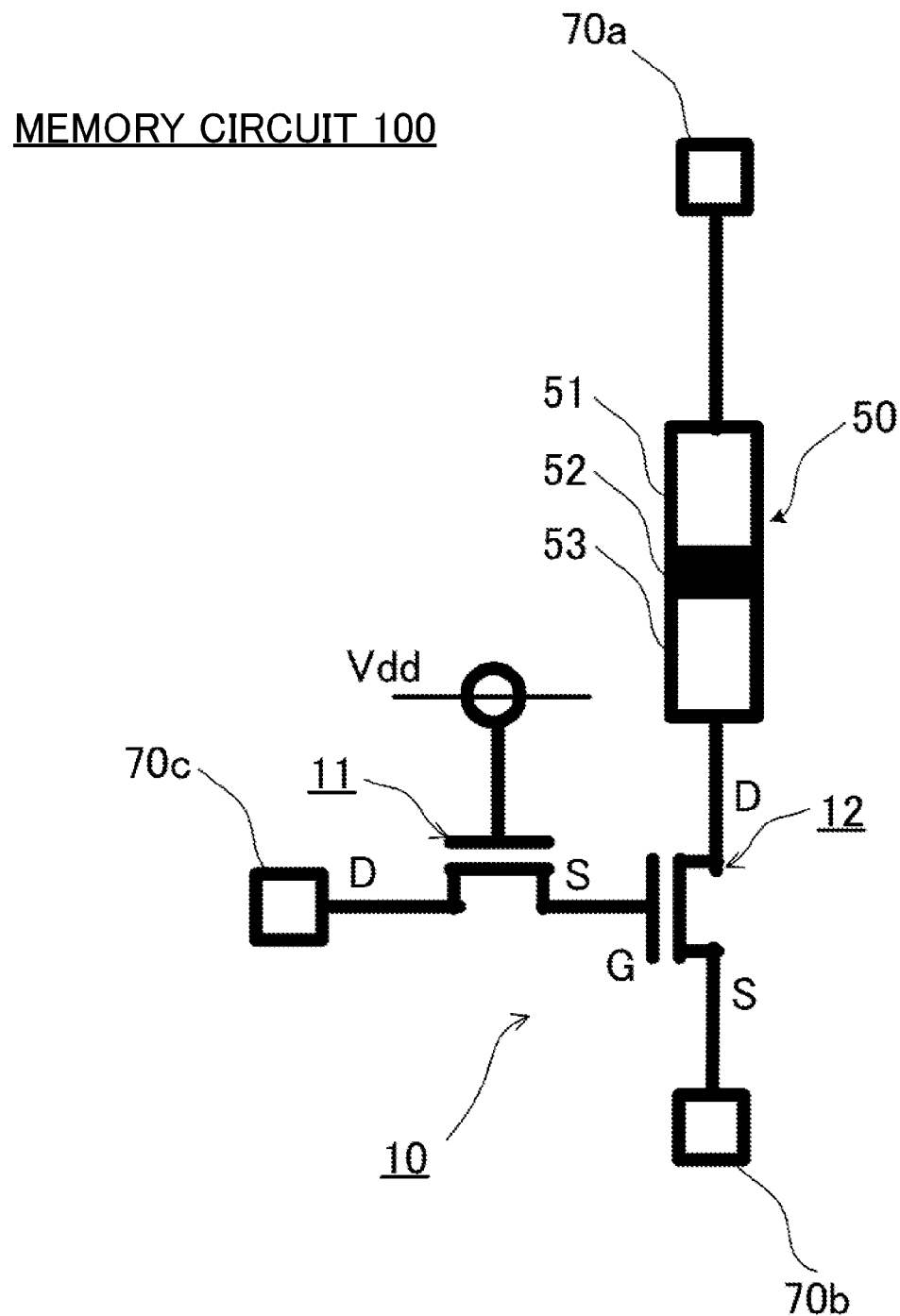
FIG. 1 is a diagram showing the configuration of the memory circuit (memory device) according to Embodiment 1.

FIG. 1 shows the configuration of a memory circuit 100 according to Embodiment 1.

The memory circuit 100 includes a selection device 10 and a magnetic tunnel junction element (MTJ element, hereafter) 50. The selection device 10 comprises two N-type MOSFETs 11 and 12.

The drain of the N-type MOSFET 12 (one end of a current path) is connected to a pin layer 53 of the MTJ element 50. A free layer 51 of the MTJ element 50 (one end of the MTJ element 50) is connected to a control terminal 70a. Moreover, the source of the N-type MOSFET 12 (the other end of the current path) is connected to a control terminal 70b.

The gate of the N-type MOSFET 12 is connected to the drain of the N-type MOSFET 11 (one end of a current path). A positive power supply voltage Vdd is applied to the gate of the N-type MOSFET 11. The source of the N-type MOSFET 11 (the other end of the current path) is connected to a selection control terminal 70c.

Here, the N-type MOSFET 12 is a driver transistor for flowing a relatively large writing current through the MTJ element 50. The N-type MOSFET 11 is a barrier transistor for controlling the N-type MOSFET 12 and almost no current flows through the N-type MOSFET 11. The N-type MOSFET 11 has a smaller channel width (element size) than the N-type MOSFET 12.

Figure 2A:
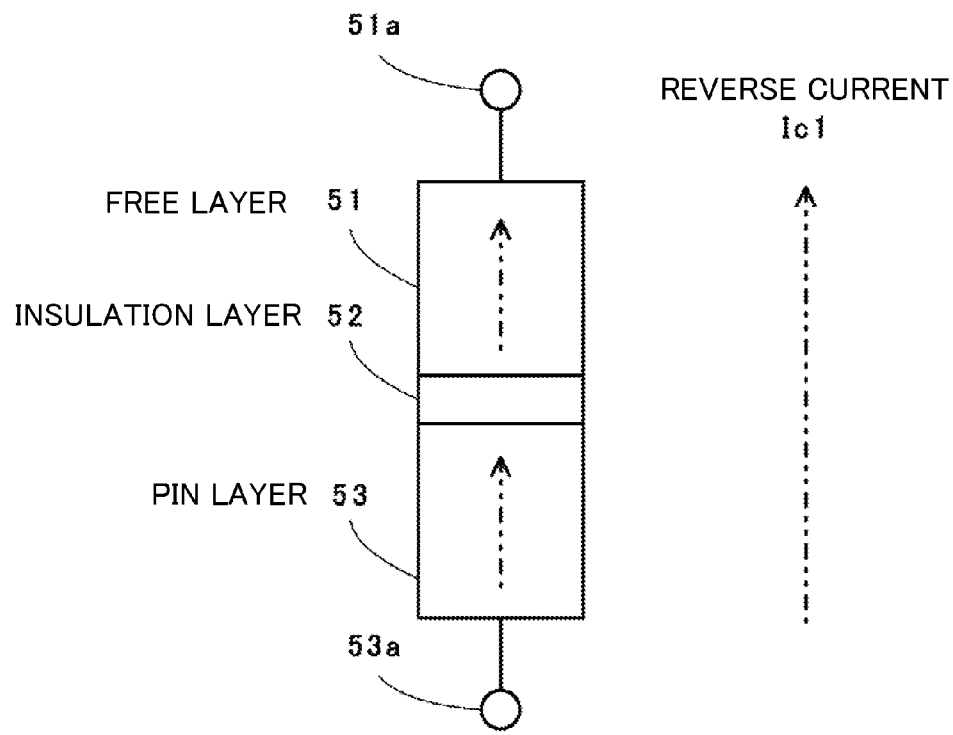
FIG. 2A is an illustration for explaining the switching of an MTJ element.
Figure 2B:
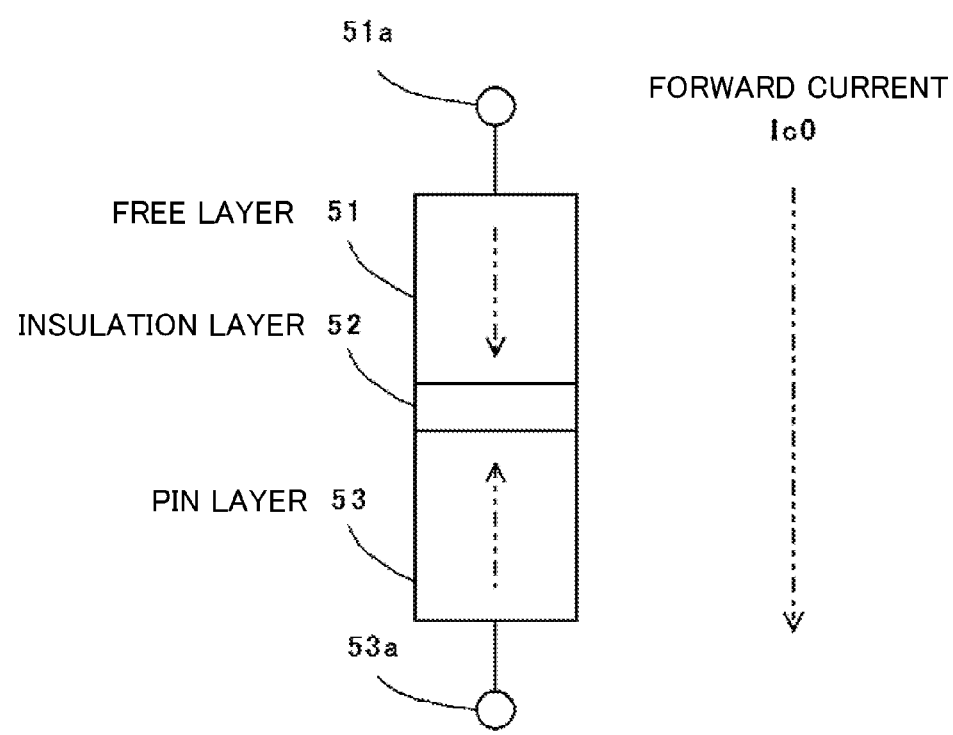
FIG. 2B is an illustration for explaining the switching of an MTJ.

Next, the MTJ element 50 comprises, as shown in FIGS. 2A and 2B, three layers, a free layer 51, an insulation layer 52, and a pin layer 53. The insulation layer 52 is formed by a thin film of MgO or $Al_2O_3$. The free layer 51 and pin layer 53 are formed by a single layer or multiple layers of ferromagnetic materials such as iron (Fe) and cobalt (Co) or their alloy. Moreover, an electrode 51a is formed on the pin layer 51 and an electrode 53a is formed on the free layer 53.

The magnetization direction of the free layer 51, which is indicated by dashed-two dotted lines, is not fixed. The magnetization direction changes as a current is supplied. On the other hand, the magnetization direction of the pin layer 53 is fixed. FIG. 2A shows the state in which the magnetization directions of the free layer 51 and pin layer 53 are the same (the parallel state) and FIG. 2B shows the state in which the magnetization directions of the free layer 51 and pin layer 53 are opposite (the antiparallel state).

Figure 3:
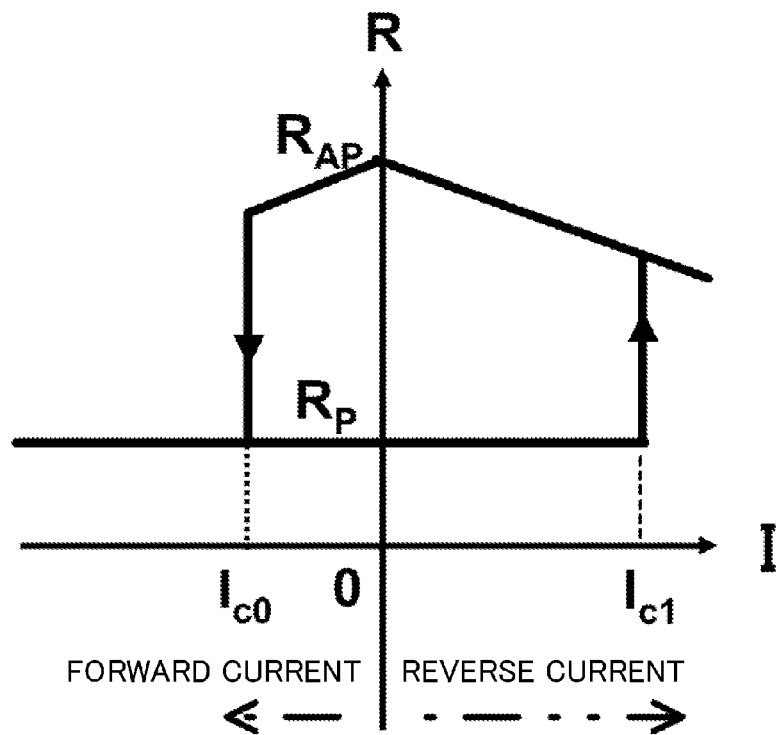
FIG. 3 is a chart showing the resistance property of an MTJ element.

The MTJ element 50 characteristically has different resistance values in the parallel state and in the antiparallel state. FIG. 3 shows the current-resistance property of the MTJ element 50. Here, the ordinate presents the resistance R and the abscissa presents the current I supplied to the MTJ element 50. The resistance value of the MTJ element 50 changes according to the relative magnetization directions of the free layer 51 and pin layer 53. This resistance change is called the tunnel magnetoresistance effect. When the magnetization directions of the free layer 51 and pin layer 53 are parallel to each other, the magnetoresistance of the MTJ element 50 is low. This state is called the low resistance state $R_P$. On the other hand, when their magnetization directions are opposite to each other, the magnetoresistance is high. This state is called the high resistance state $R_{AP}$.

When a current flowing in the direction from the free layer 51 to the pin layer 53 (a forward current Ic0) is supplied while the MTJ element 50 is in the antiparallel state as shown in FIG. 2B, multi-spin electrons introduced into the free layer 51 from the pin layer 53 cause the magnetization of the free layer 51 to invert, whereby the MTJ element 50 becomes in the parallel state (low resistance state $R_P$). On the other hand, when a current flowing from the pin layer 53 to the free layer 51 (a reverse current Ic1) is supplied while the MTJ element 50 is in the parallel state as shown in FIG. 2A, spin electrons are introduced into the pin layer 53 from the free layer 51. However, the spin electrons that are not parallel to the magnetization of the pin layer 53 are reflected by the insulation layer 52. As a result, the magnetization of the free layer 51 is inverted and the MTJ element 50 becomes in the antiparallel state (high resistance state $R_{AP}$).

When the reverse current Ic1 is supplied while in the antiparallel state, the MTJ element 50 does not change and maintains the state. Moreover, when the forward current Ic0 is supplied while in the parallel state, the MTJ element 50 maintains the state as well.

Here, it is known that the reverse current Ic1 for switching from the parallel state (low resistance state $R_P$) to the antiparallel state (high resistance state $R_{AP}$) is larger than the forward current Ic0 for switching from the antiparallel state (high resistance state $R_{AP}$) to the parallel state (low resistance state $R_P$) as shown in FIG. 3.

The MTJ element 50 can be used as a memory element by associating the parallel state and antiparallel state with, for example, "0" and "1" and controlling the parallel state and antiparallel state.

Figure 4:
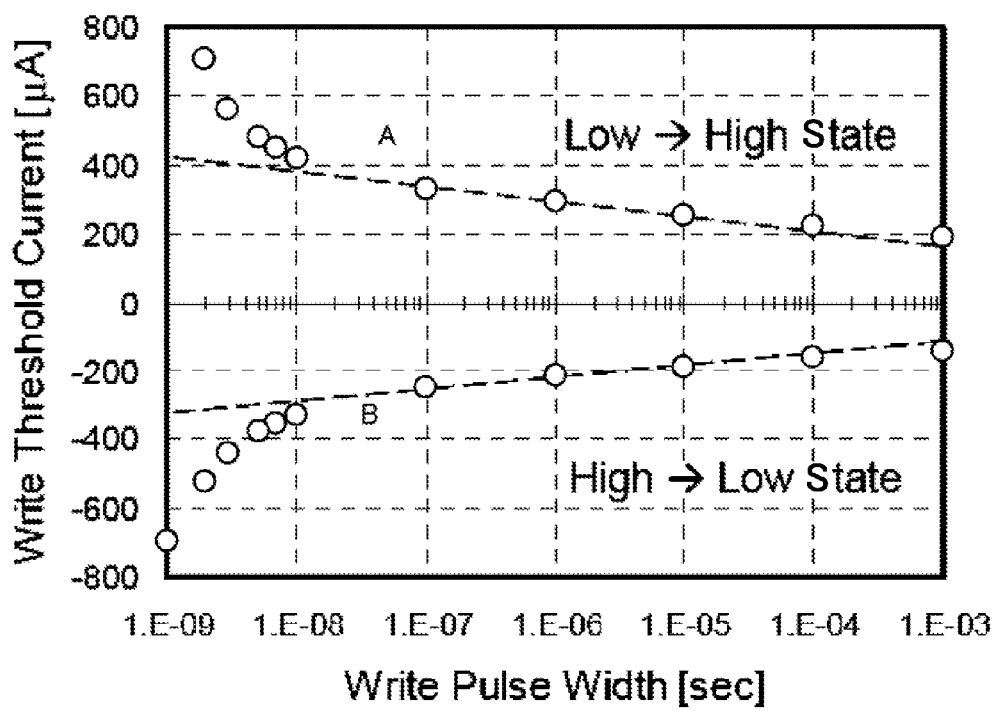
FIG. 4 is a chart showing the switching property of an MTJ element.

Moreover, FIG. 4 shows the switching property of the MTJ element 50. Here, the ordinate presents the threshold current necessary for writing and the abscissa presents the writing pulse width (time). A curve A presents the magnitude and time properties of the reverse current Ic1 for switching from the parallel state (low resistance state $R_P$) to the antiparallel state (high resistance state $R_{AP}$). On the other hand, a curve B presents the magnitude and time properties of the forward current Ic0 for switching from the antiparallel state (high resistance state $R_{AP}$) to the parallel state (low resistance state $R_P$).

As shown in FIG. 4, both with the forward current Ic0 and with the reverse current Ic1, a larger current is required for writing as the writing pulse width is smaller. In other words, it is necessary to flow a somewhat large current for switching the MTJ element 50 at a high speed so as to work as a high speed device. Therefore, it is also required to flow a somewhat large current through the N-type MOSFET 12 constituting the selection device 10.

The operation of the memory circuit 100 is described next with reference to FIGS. 5, 6A, and 6B. In the following explanation, the technology node of 90 nm is used and the power supply voltage reference of the memory circuit 100 is 1V. Moreover, the N-type MOSFETs 11 and 12 have a threshold voltage Vth=0.2V.

Figure 5:
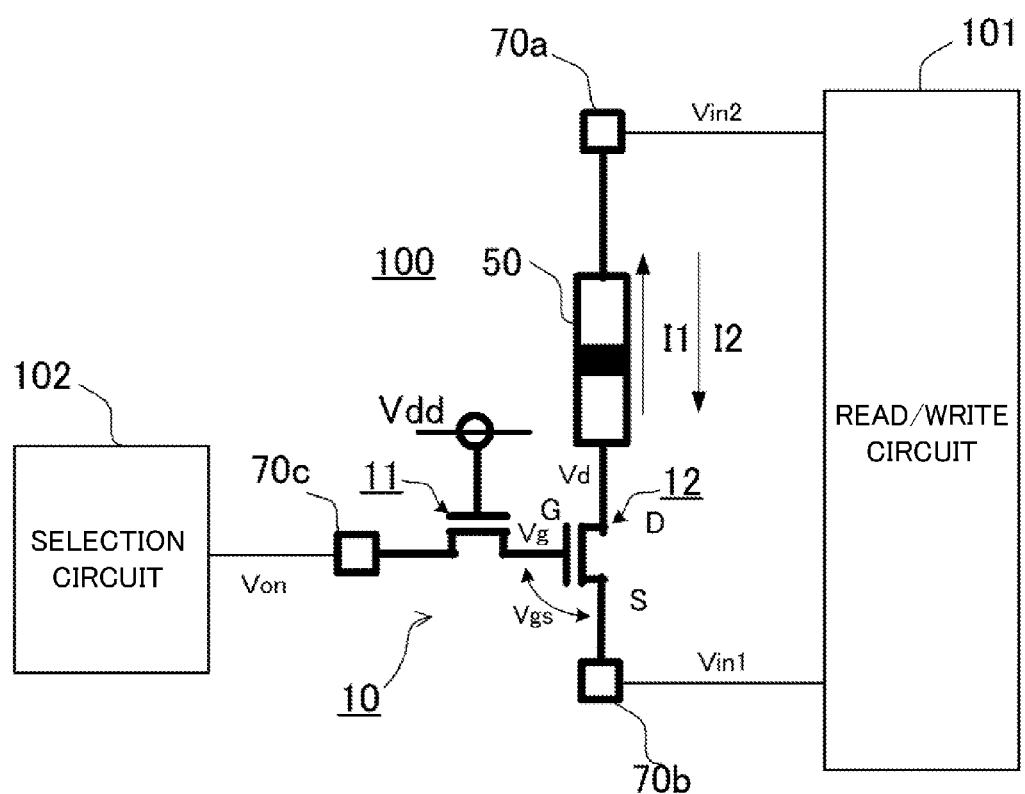
FIG. 5 is a diagram for explaining the operation of the memory circuit (memory device) according to Embodiment 1.

For using the memory circuit 100, as shown in FIG. 5, the control terminals 70a and 70b are connected to a read/write circuit 101, and the selection control terminal 70c is connected to a selection circuit 102. A power supply voltage Vdd (≈1V) is applied to the gate of the N-type MOSFET 11. When the memory circuit 100 is in the unselected state, as shown in FIGS. 6A and 6B, the selection circuit 102 applies a voltage Von of 0V to the selection control terminal 70c, and the read/write circuit 101 applies voltages Vin1 and Vin2 of 0V to the control terminals 70a and 70b. At this point, the N-type MOSFET 12 is off and no current flows through the N-type MOSFET 12. Therefore, no current flows through the MTJ element 50 either.

Figure 6A:
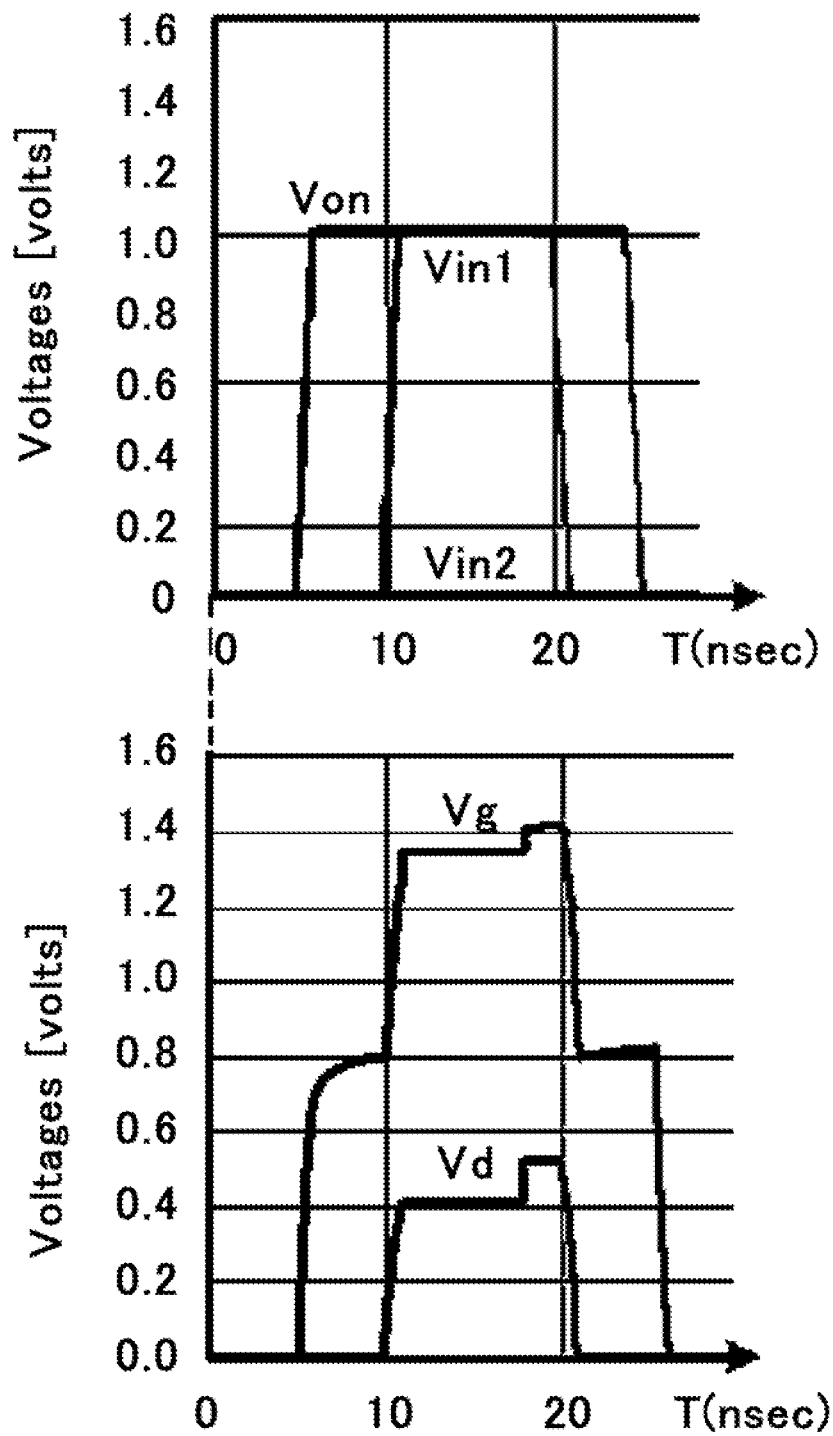
FIG. 6A is a chart showing the voltage changes at the nodes of the memory circuit according to Embodiment 1 for flowing a writing current I1 shown in FIG. 5.

For flowing a current I1 through the MTJ element 50, first, the selection circuit 102 applies an on voltage Von (1V) to the selection control terminal 70c as shown in FIG. 6A. As a result, the gate voltage Vg applied to the N-type MOSFET 12 via the N-type MOSFET 11 becomes Von−Vth≈1V−0.2V≈0.8V.

Subsequently, the read/write circuit 101 sets the voltage Vin1 to a high level (≈1V) while maintaining the voltage Vin2 at the level of 0V. As a result, the current I1 starts to flow through the N-type MOSFET 12.

The capacitive coupling between the channel and gate of the N-type MOSFET 12 causes the gate voltage Vg to rise to approximately Vin1+Von−Vth≈1.35V. Along with this, the drain voltage Vd of the N-type MOSFET 12 also rises. Therefore, the N-type MOSFET 12 has an increased current drive capability and the N-type MOSFET 12 can supply a current I1 necessary and sufficient for switching the MTJ element 50 between the parallel state and antiparallel state. Moreover, the raised gate voltage Vg causes the N-type MOSFET 11 to be cut off and turned off. As a result, the charge between the source and gate of the N-type MOSFET 12 is retained and the event of the gate voltage Vg dropping to the power supply voltage does not occur.

After completing the writing, the read/write circuit 101 drops the voltage Vin1 to 0V and subsequently the selection circuit 102 sets the on voltage Von to 0V.

Figure 6B:
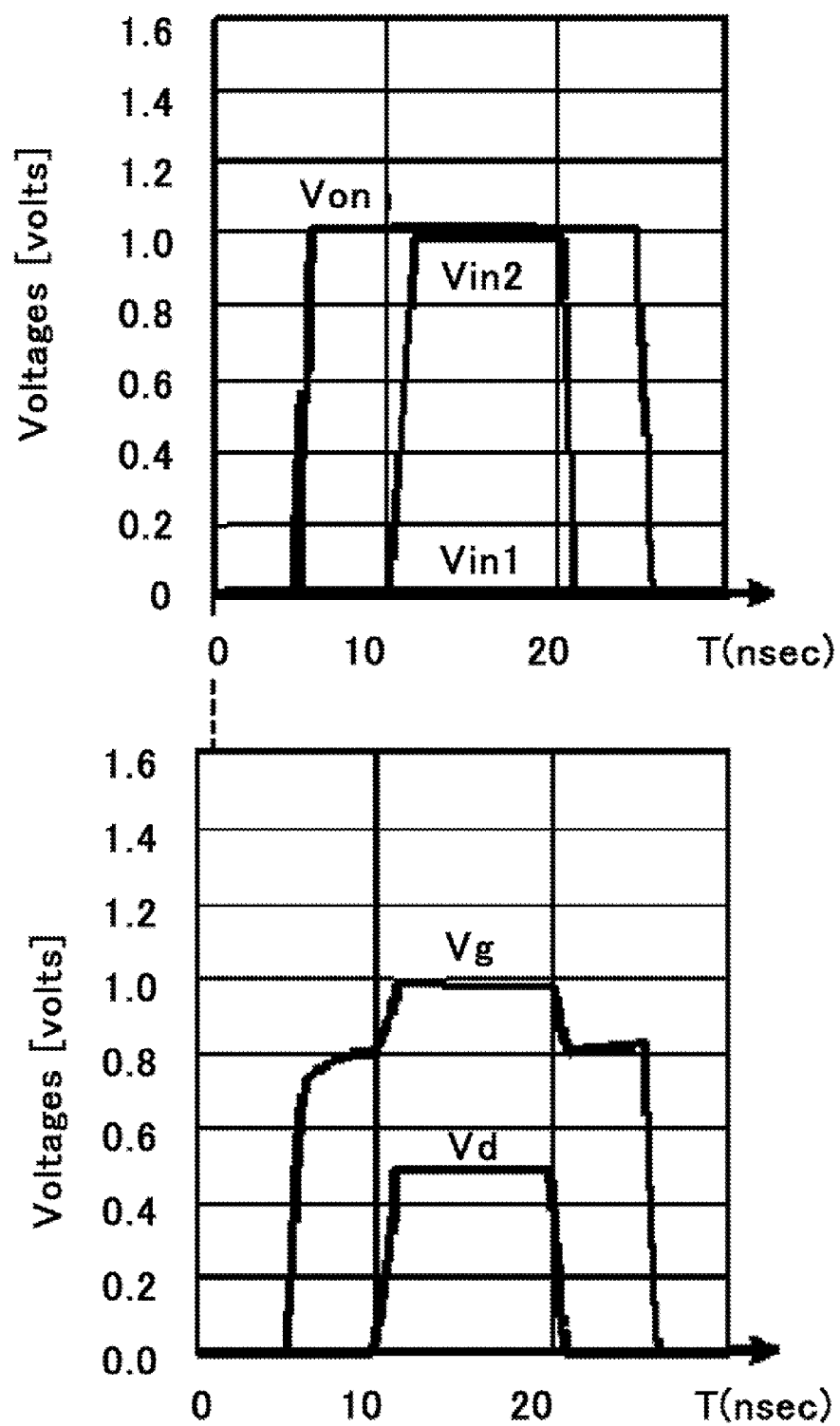
FIG. 6B is a chart showing the voltage changes at the nodes of the memory circuit according to Embodiment 1 for flowing a writing current I2 shown in FIG. 5.

On the other hand, for flowing a current I2 through the MTJ element 50, the selection circuit 102 first applies the on voltage Von (≈1V) to the selection control terminal 70c as shown in FIG. 6B. As a result, the gate voltage Vg≈Von−Vth1=1V−0.2V≈0.8V is obtained.

Subsequently, the read/write circuit 101 sets the Vin2 to a high level (≈1V) while maintaining Vin1=0. As a result, the current I2 starts to flow. The capacitive coupling between the channel and gate causes the gate voltage Vg to rise to approximately 1V. Therefore, the N-type MOSFET 12 can supply a sufficient current I2 to the MTJ element 50. Moreover, the raised gate voltage Vg causes the N-type MOSFET 11 to be cut off and turned off. As a result, the charge between the source and gate of the N-type MOSFET 12 is retained and the event of the gate voltage Vg dropping to the power supply voltage does not occur.

Subsequently, as the voltage supply from the control terminals 70c and 70a is stopped, the voltages at the nodes G and D drop and eventually reach 0V.

As described above, in the memory circuit 100, the selection device 10 can serve for flowing a sufficient current through the MTJ element 50 in both directions and switching the MTJ element 50 between the parallel state and antiparallel state.

On the other hand, in the reading operation, the selection circuit 102 sets the Von to a high level to select the memory element 100, and subsequently the read/write circuit 101 directly or indirectly measures the resistance value (high or low) of the MTJ element 50. The read/write circuit 101 identifies data corresponding to the measured resistance value.

Embodiment 2

In the above-described embodiment 1, the selection device comprises N-type MOSFETs. However, even where the selection device comprises P-type MOSFETs, it is possible to supply a current in both directions.

Figure 7:
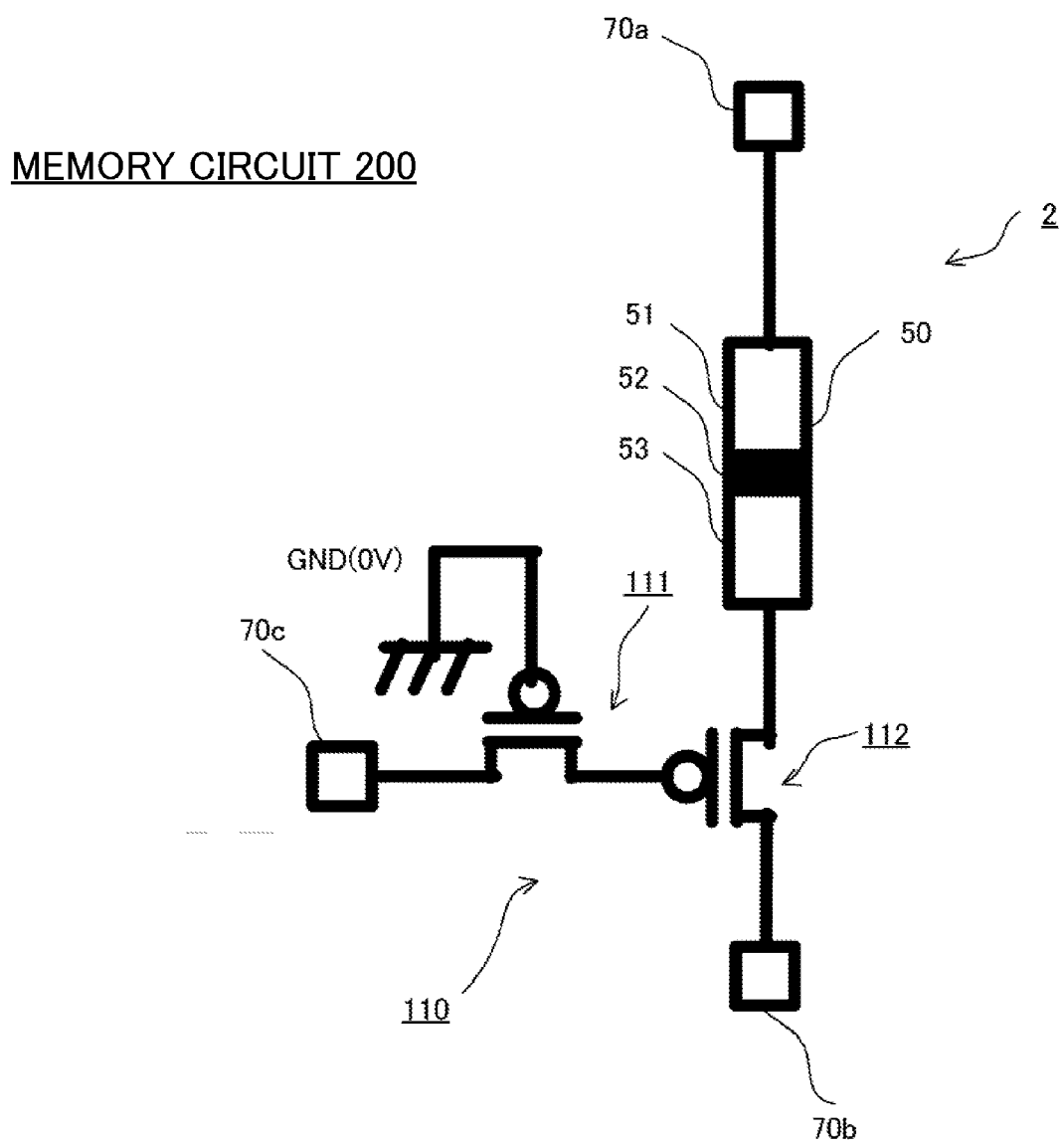
FIG. 7 is a diagram showing the configuration of the memory circuit according to Embodiment 2.

FIG. 7 shows the configuration of a memory circuit 200 including a selection device 110 comprising P-type MOSFETs and the MTJ element 50. The difference from Embodiment 1 is that two P-type MOSFETs 111 and 112 are used as the selection device 110. Moreover, the gate of the P-type MOSFET 111 is connected to a ground GND (0V).

Figure 8A:
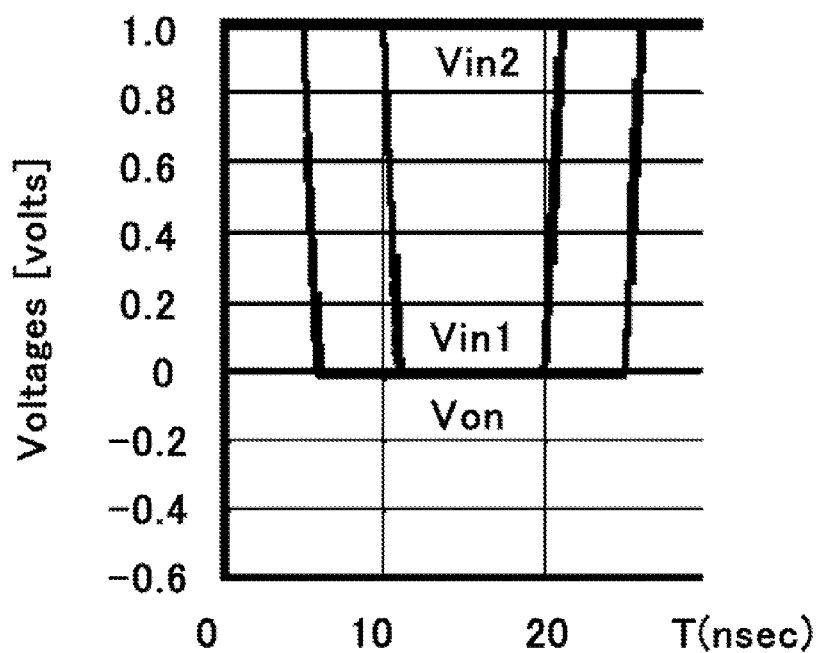
FIG. 8A is a chart showing the voltage changes at the nodes of the memory circuit according to Embodiment 2 for flowing a writing current.
Figure 8A:
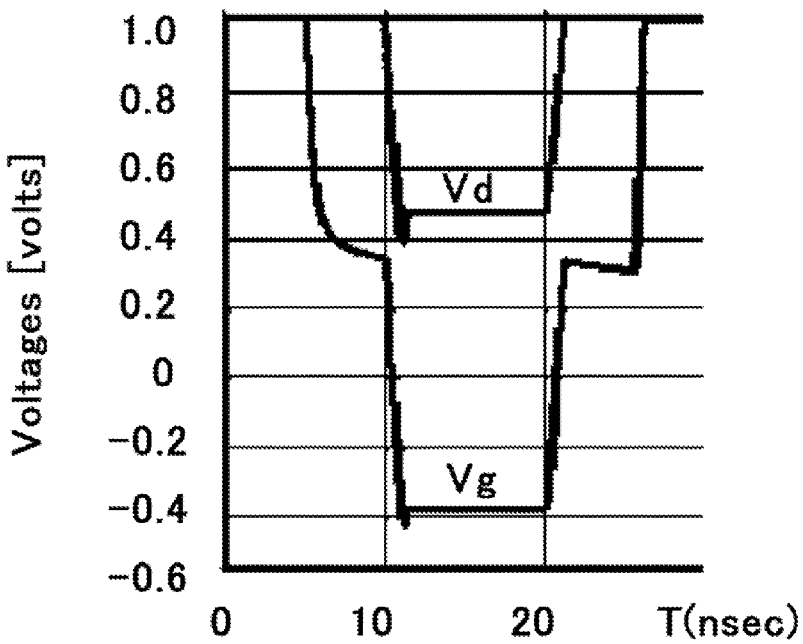
Figure 8B:
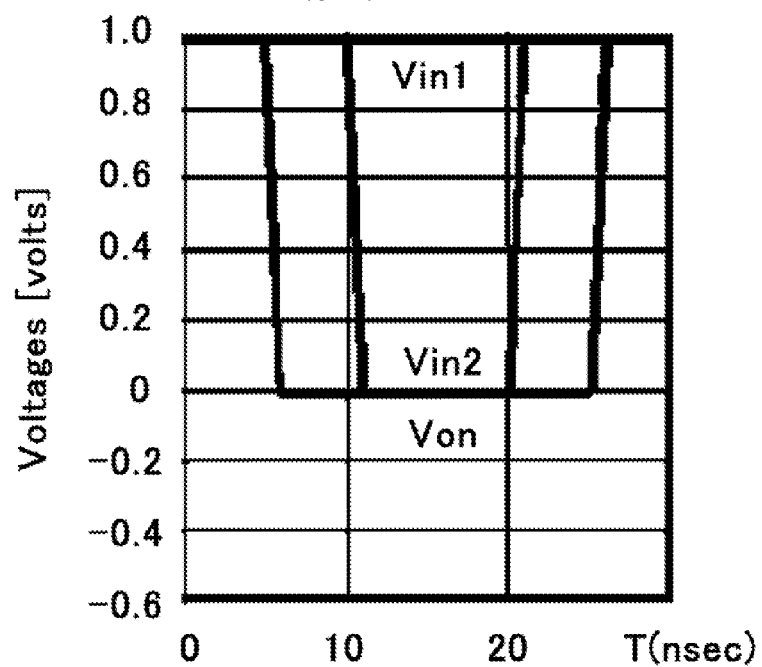
FIG. 8B is a chart showing the voltage changes at the nodes of the memory circuit according to Embodiment 2 for flowing a reverse writing current.
Figure 8B:
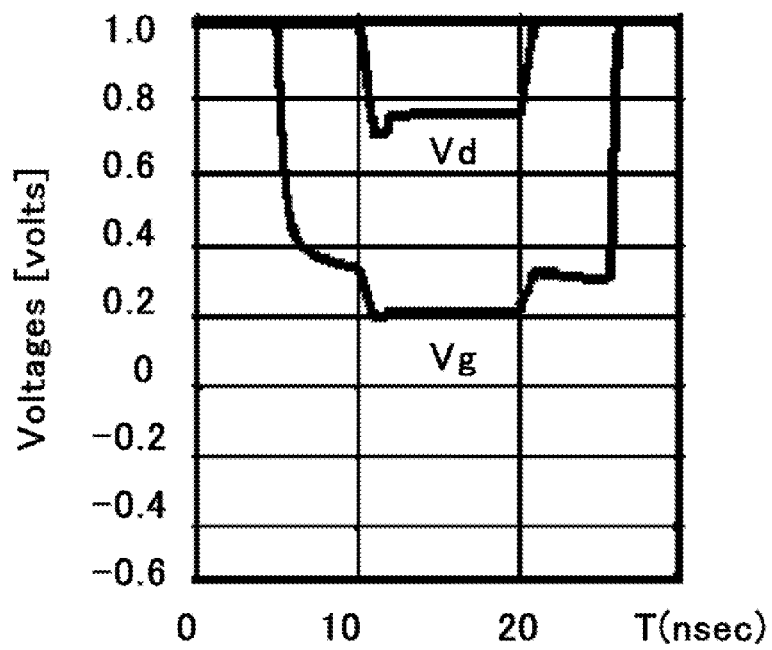

The operation of the memory circuit 200 will be described hereafter with reference to FIGS. 8A and 8B. Here, although not shown, the read/write circuit 101, selection circuit 102, and the like are connected as in FIG. 5. When the memory circuit 200 is in the unselected state, as shown in FIGS. 8A and 8B, a voltage Von of 0V is applied to the selection control terminal 70c and voltages Vin1 and Vin2 of 1V are applied to the control terminals 70a and 70b. At this point, the P-type MOSFET 112 is off and no current flows through the P-type MOSFET 112. Therefore, no current flows through the MTJ element 50 either.

For flowing the current I1 through the MTJ element 50, a voltage of 0V as the on voltage Von is applied to the selection control terminal 70c as shown in FIG. 8A. The node G on the gate side of the P-type MOSFET 111 drops from 1V to a voltage |Vth1|. Here, Vth1 is the threshold voltage of the P-type MOSFET 111 and has a negative value.

Here, the voltage Vin1 applied to the control terminal 70b is decreased from 1V to 0V. Here, the control terminal 70a has a potential of 1V. The voltage at the node G exceeds a threshold voltage Vth2 of the P-type MOSFET 112 and therefore a channel is formed in the P-type MOSFET 112, whereby a current flows between the source and drain of the P-type MOSFET 112.

The capacitive coupling between the channel and gate causes the voltage at the node G to further drop. Therefore, the P-type MOSFET 112 is biased into the linear range.

As a current flows between the source and drain of the P-type MOSFET 112 as described above, a current path including the MTJ element 50 and P-type MOSFET 112 is formed and a current flows in the direction from the pin layer 53 to the free layer 51 of the MTJ element 50. Moreover, as the P-type MOSFET 112 is turned off via the P-type MOSFET 111, the current path including the MTJ element 50 and P-type MOSFET 112 is cut off, whereby the current supply to the MTJ element 50 is stopped.

On the other hand, for flowing a current through the MTJ element 50 in the reverse direction, the memory circuit 200 operates as follows.

As shown in FIG. 8B, a voltage of 0V as the on voltage Von is applied from the selection control terminal 70c. The node G on the gate side of the MOSFET 111 drops from 1V to the voltage |Vth1|.

Here, the voltage Vin2 applied to the control terminal 70a is decreased from 1V to 0V. Here, it is assumed that the control terminal 70b has a potential of 1V. At this point, the voltage at the node G exceeds the threshold voltage Vth2 of the P-type MOSFET 112 and therefore a channel is formed in the P-type MOSFET 112. Therefore, a current flows from the drain to the source of the P-type MOSFET 112. In other words, a current in the reverse direction to the one described earlier flows.

The capacitive coupling between the channel and gate causes the voltage at the node G to further drop and the P-type MOSFET 112 is inversely biased into the linear range.

Therefore, a current path including the MTJ element 50 and P-type MOSFET 112 is formed and a current flows in the direction from the free layer 51 to the pin layer 53 of the MTJ element 50. Moreover, as the P-type MOSFET 112 is turned off via the P-type MOSFET 111, the current path including the MTJ element 50 and P-type MOSFET 112 is cut off, whereby the current supply to the MTJ element 50 is stopped.

As described above, also in the memory circuit 200, the selection device 120 can serve for flowing a sufficient current through the MTJ element 50 in both directions and switching the MTJ element 50 between the parallel state and antiparallel state as in Embodiment 1.

Figure 9:
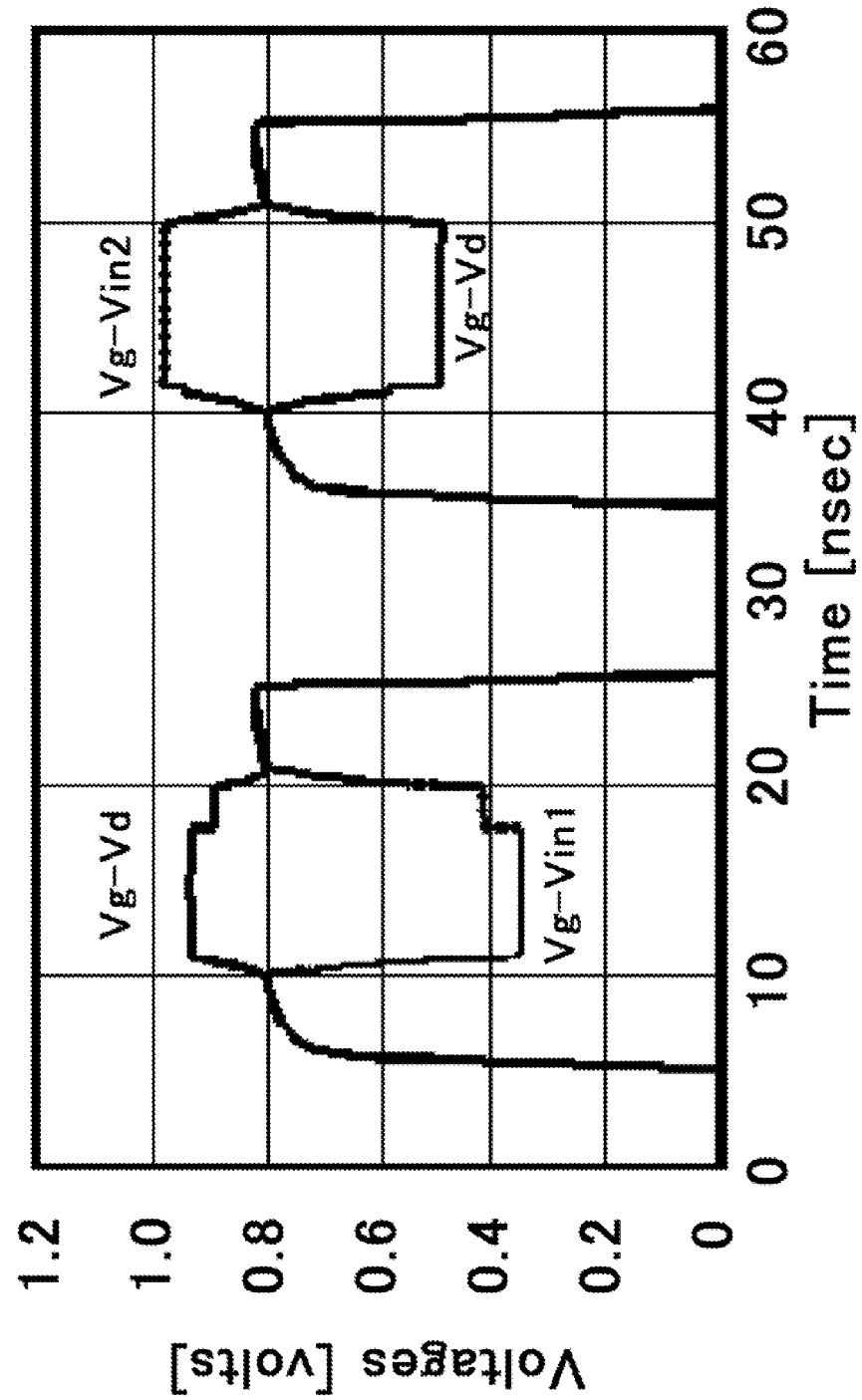
FIG. 9 is a chart showing the changes with time in the potential differences between the nodes of the memory circuit according to Embodiment 1.

Here, the voltage Vg at the node G of the MOSFET 12 of the memory circuit 100 shown in FIG. 1 is a potential of 1V or higher as shown in FIGS. 6A and 6B. FIG. 9 shows the changes with time in the voltage differences between Vg and Vd, Vg and Vin1, and Vg and Vin2 corresponding to the voltage change waveforms at the nodes shown in FIGS. 6A and 6B. As shown in FIG. 9, none of the voltage differences between Vg and Vd, Vg and Vin1, and Vg and Vin2 exceeds 1V. Therefore, there is no doubt about the reliability of the insulation film of the MOSFET 12 of the memory circuit 100 shown in FIG. 1. Moreover, the same is true for the gate insulation film of the MOSFET 112 of the memory circuit 200 shown in FIG. 7.

Next, the channel width of the selection device is discussed for explaining one of the superior features of the selection device according to the embodiments. Here, selection devices comprising an N-type MOSFET, P-type MOSFET, or CMOS and the selection device 10 comprising two N-type MOSFETs described in the above Embodiment 1 (the Boosted NFET, hereafter) are compared. Here, all circuits are configured to complete the switching within 10 nanoseconds in both directions.

Figure 10:
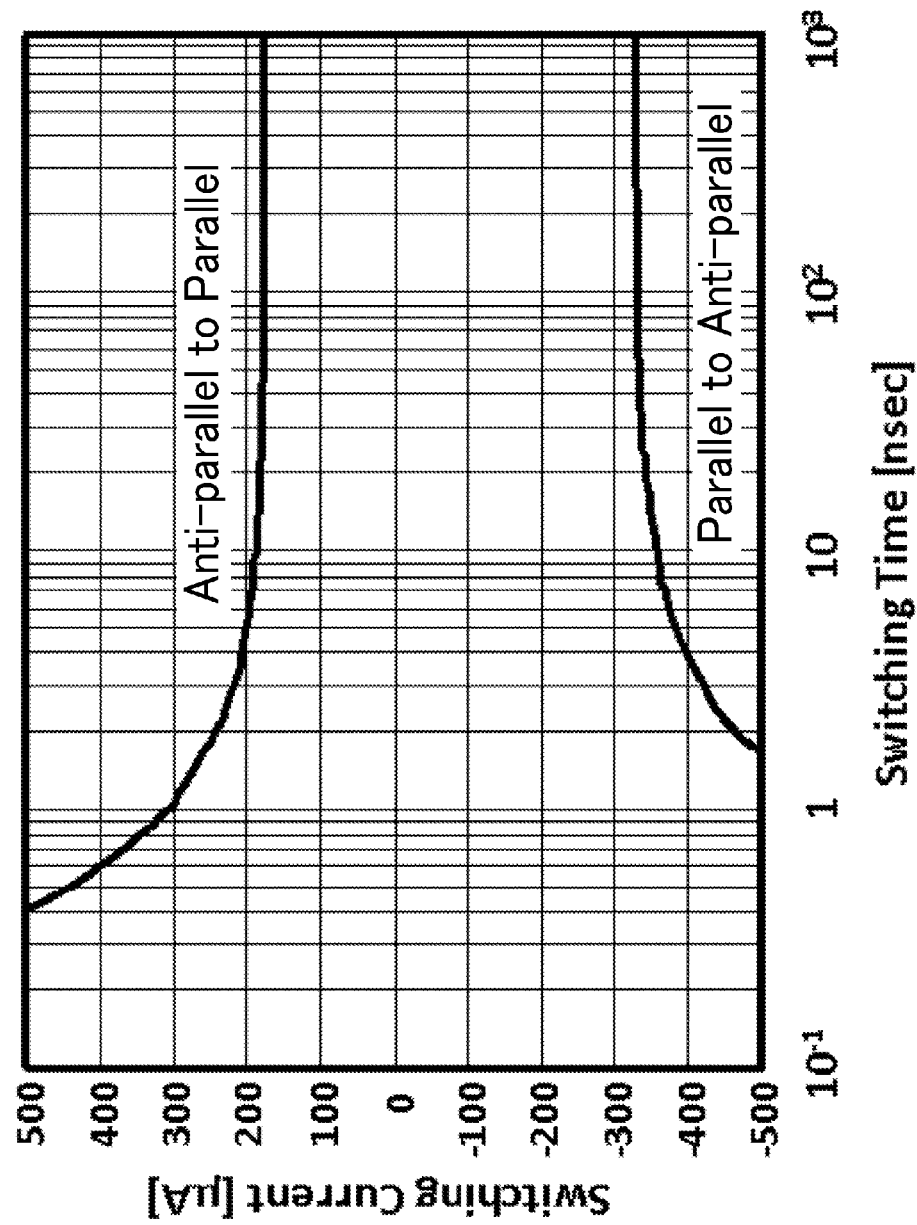
FIG. 10 is a chart showing the switching property of an MTJ model.

FIG. 10 shows the switching property of an MTJ element model used in the comparison (the MTJ model, hereafter). The MTJ model has the switching property as shown in FIG. 10, and has a resistance value in the parallel state, $R_P$, of 1.2 kΩ and a resistance value in the antiparallel state, $R_{AP}$, of 2.56 M.

In each circuit in which the selection device comprised an N-type MOSFET (an NFET as appropriate, hereafter), a P-type MOSFET (a PFET as appropriate, hereafter), a CMOS or the MTJ element was connected in the bottom pin structure, the channel width of the selection device was measured with the power supply voltage Vdd changed from 0.8V to 1.2V by 0.05V at a time. Here, with the CMOS and Boosted NFET, a total of two channel widths was used as the channel width.

Figure 11:
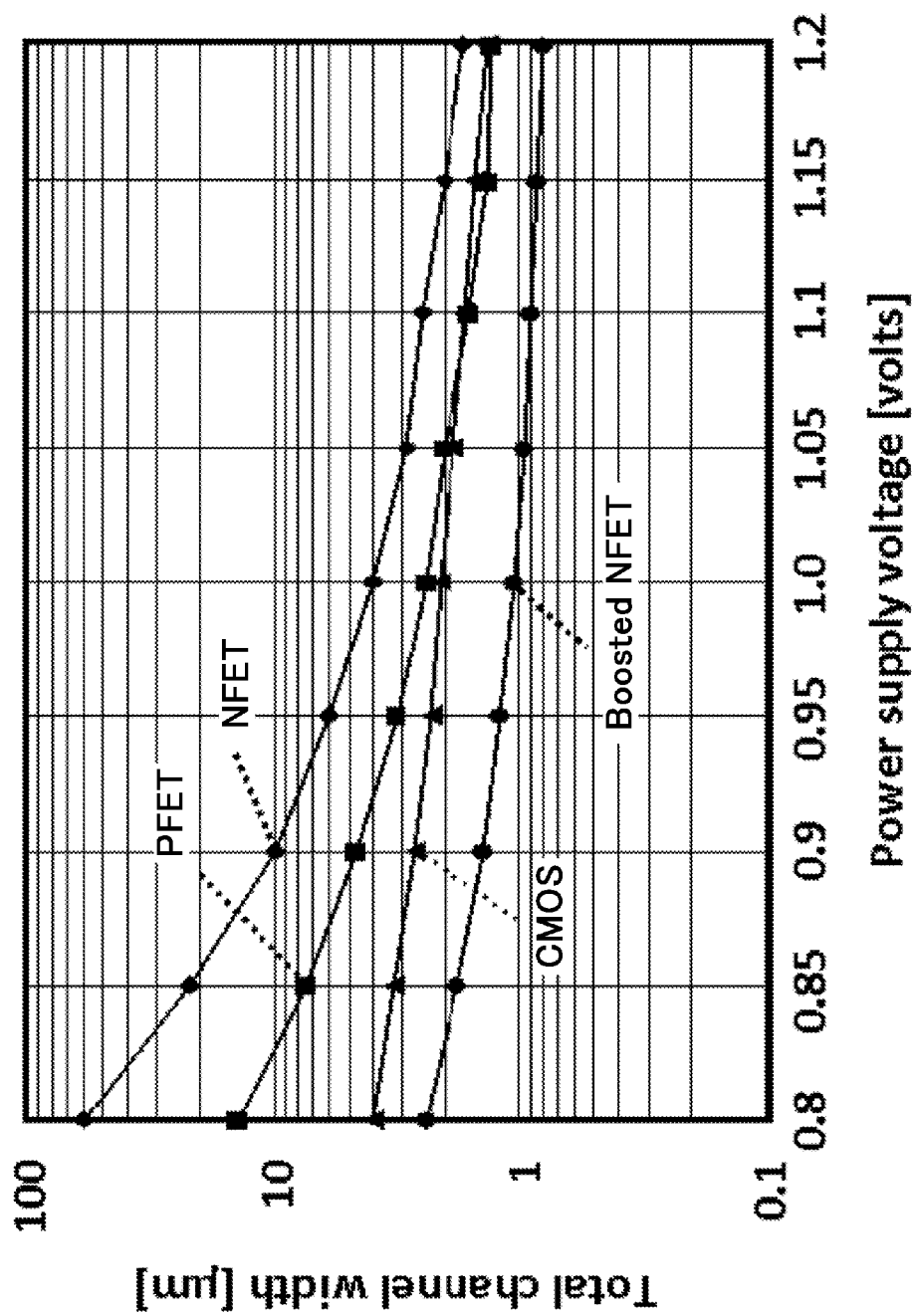
FIG. 11 is a chart showing the channel width simulation results of multiple kinds of selection devices.

FIG. 11 shows the simulation results. The vertical axis presents the channel width and the horizontal axis presents the power supply voltage Vdd. As shown in FIG. 11, the total channel width of the Boosted NFET is the smallest. Therefore, it is advantageous for size reduction and higher levels of integration.

Next, the selection devices were produced with the 90 nm technology and used to simulate the applied voltage required for the MTJ element to switch from the parallel state to the antiparallel state and the time required for the switching with the power supply voltage of 1V. The selection devices comprised an NFET, PFET, CMOS, or the Boosted NFET, and the MTJ element was connected in the bottom pin structure. The above-mentioned MTJ model was used as the MTJ element.

Figure 12:
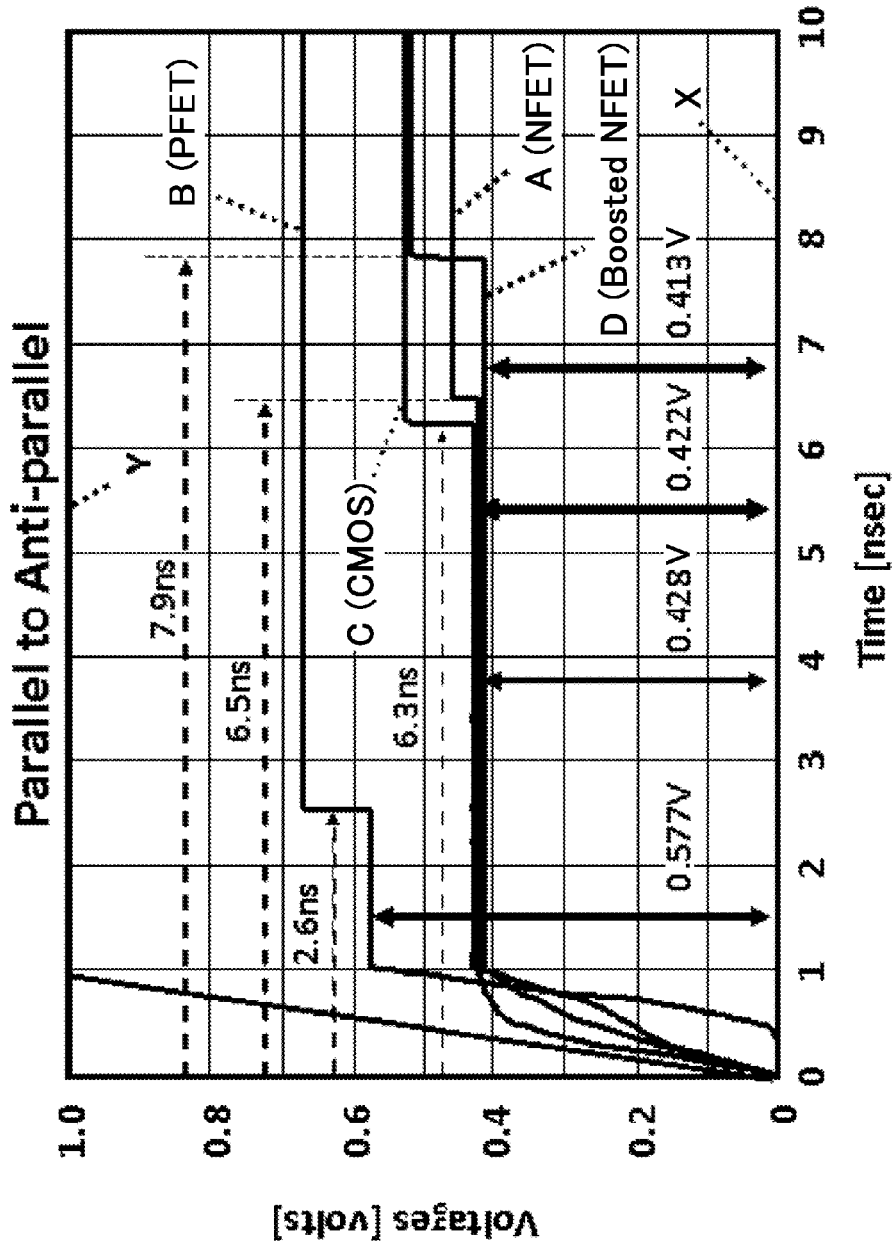
FIG. 12 is a chart showing the MTJ element switching simulation results.

As shown in FIG. 12, when an NFET is used, the voltage required for the switching is 0.422V and the time required for the switching is 6.5 nanoseconds. When a PFET is used, the voltage required for the switching is 0.577V and the time required for the switching is 2.6 nanoseconds. When a CMOS is used, the voltage required for the switching is 0.428V and the time required for the switching is 6.3 nanoseconds. When the Boosted NFET is used, the voltage required for the switching is 0.413V and the time required for the switching is 7.9 nanoseconds. In any case, the switching can be done in less than 10 nanoseconds.

The same configurations were used to simulate the applied voltage required for the MTJ to switch from the antiparallel state to the parallel state and the time required for the switching.

Figure 13:
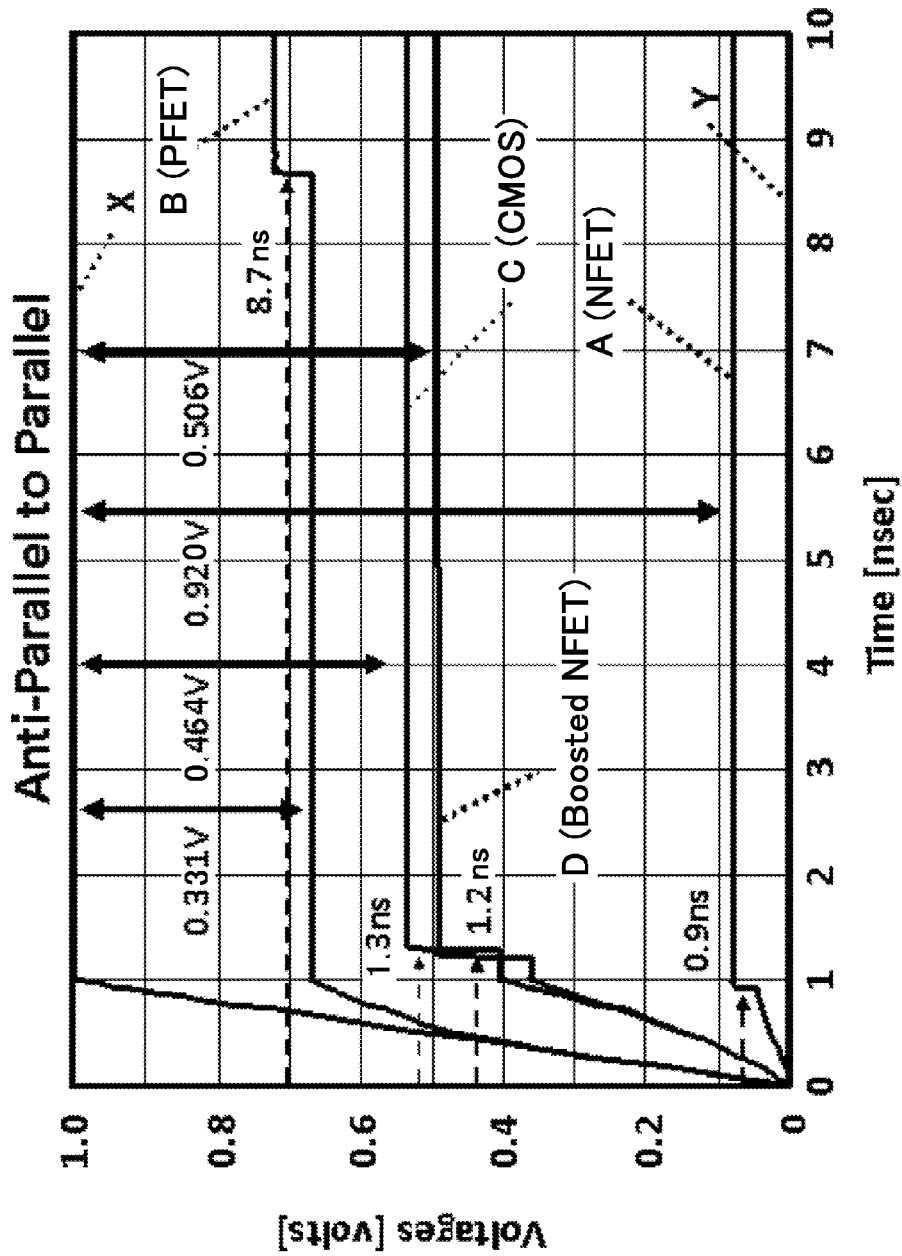
FIG. 13 is a chart showing the MTJ element switching simulation results.
Figure 14A:
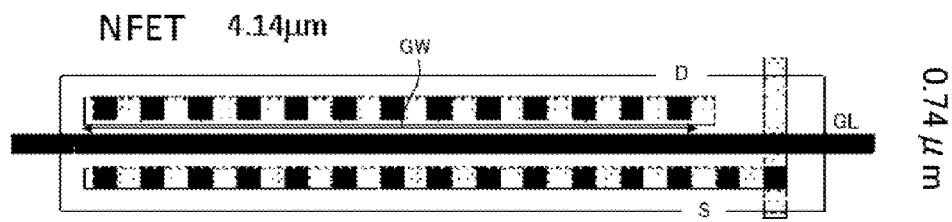
FIG. 14A is an illustration showing the layout of the NFET used in the simulation.
Figure 14B:
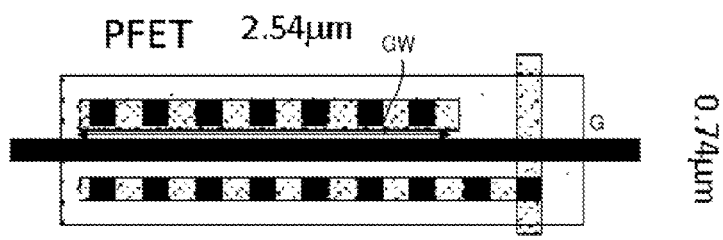
FIG. 14B is an illustration showing the layout of the PFET used in the simulation.
Figure 14C:
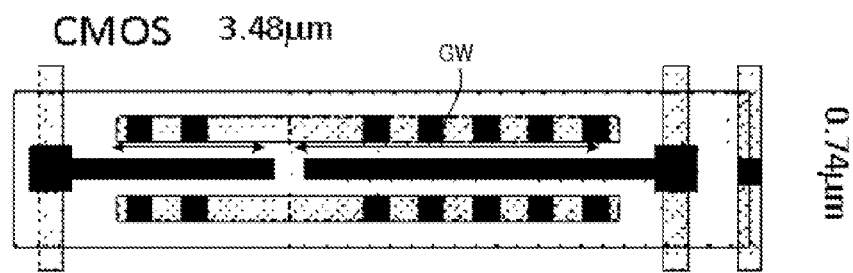
FIG. 14C is an illustration showing the layout of the CMOS used in the simulation.
Figure 14D:
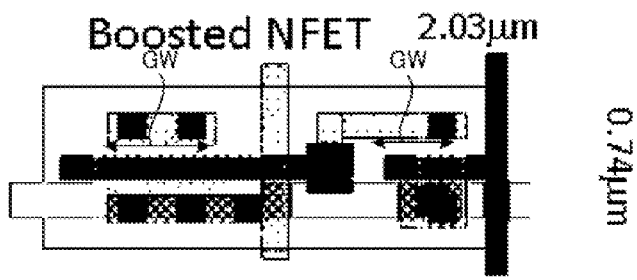
FIG. 14D is an illustration showing the layout of the Boosted NFET used in the simulation.

FIG. 13 shows the simulation results. When an NFET is used, the voltage required for the switching is 0.920V and the time required for the switching is 0.9 nanoseconds. When a PFET is used, the voltage required for the switching is 0.331V and the time required for the switching is 8.7 nanoseconds. When a CMOS is used, the voltage required for the switching is 0.464V and the time required for the switching is 1.3 nanoseconds. When the Boosted NFET is used, the voltage required for the switching is 0.506V and the time required for the switching is 1.2 nanoseconds. In any case, the switching can be done in less than 10 nanoseconds. As described above, when the Boosted NFET according to Embodiment 1 is used, sufficient switching speeds can be obtained.

FIGS. 14A, 14B, 14C, and 14D show the layouts of the selection devices used in the above simulations. The selection devices all have the same width of 0.74 micrometer. However, when the Boosted NFET is used, the selection device has a length of 2.03 micrometers, which is shorter than the other devices. In other words, when the Boosted NFET is used, the area of the selection device can be minimized.

Figures 15, 16:
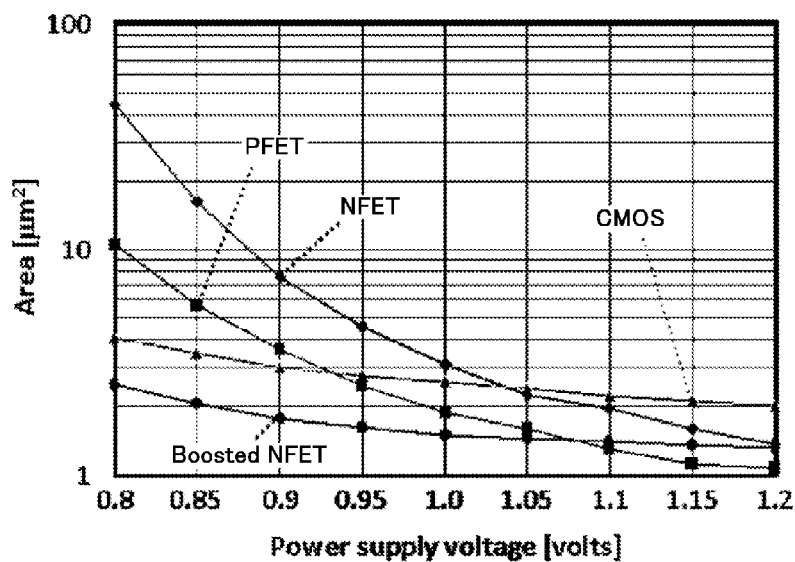
FIG. 15 is a chart showing the relationship between the power supply voltage and the element area of various selection devices in the technology node of 90 nm.
FIG. 16 is a chart showing the MTJ scaling in the technology nodes of 90 nm and smaller.

Moreover, FIG. 15 shows the relationship between the power supply voltage and device area in the technology node of 90 nm. As shown in the figure, in the technology node of 90 nm, the Boosted NFET is the best in terms of the occupancy area when the power supply voltage is 1.05V or lower.

Moreover, FIG. 16 shows how the device size and parameters change as the MTJ element is scaled down along with the MOSFET from the 90 nm technology. Here again, it is assumed that the MTJ element can switch in less than 10 ns in both directions. Moreover, the thickness of the MgO film (insulating layer) is fixed.

Figure 17:
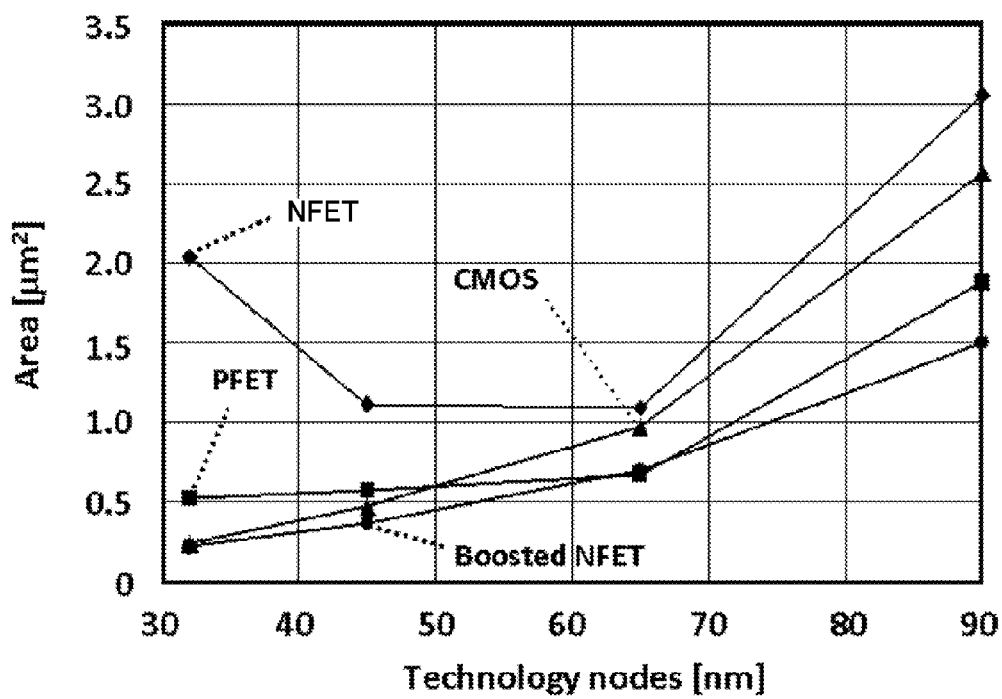
FIG. 17 is a chart showing the element areas of the selection elements in the technology nodes of 90 nm and smaller.

FIG. 17 shows the occupancy areas of the selection devices in different technology nodes that are required for driving the scaled MTJ element. It is known from FIG. 17 that the Boosted NFET is the best in the technology node generations of 90 nm to 32 nm.

Moreover, FIG. 18 shows the ratio between the diameter of the MTJ element and the size of the selection device when the MTJ and selection device are optimized in the technology node generations of 90 nm to 32 nm. Here, MTJφ, Wn1, and Wn2 present the diameter of the MTJ element, the channel width of the driver transistor of the proposed MTJ selection device (the larger transistor; the MOSFET 12 in FIG. 1 and the MOSFET 112 in FIG. 7), and the channel width of the barrier transistor of the proposed MTJ selection device (the smaller transistor; the MOSFET 11 in FIG. 1 and the MOSFET 111 in FIG. 7), respectively.

It is known from the table and the like that in the technology node generations of 90 nm to 32 nm, it is desirable that the ratio between the channel width of the driver transistor of the MTJ selection device and the diameter of the MTJ (Wn1/MTJφ) and the ratio between the channel widths of the driver transistor and barrier transistor of the MTJ selection device (Wn1/Wn2) satisfy the following expression:

$$4 \leq Wn1/MTJ\varphi \leq 15,\ 2 \leq Wn1/Wn2 \leq 5.$$

Here, desirably, $6 \leq Wn1/MTJ\varphi \leq 12$, $4 \leq Wn1/Wn2 \leq 5$. If those ranges are not satisfied, in the technology node generations of 90 nm to 32 nm, the size ratios between the devices constituting a memory element are poorly balanced, whereby something is wasted and the efficiency lowers.

Exemplary applications of the Boosted NFET described in the above embodiments are described next. FIGS. 19 to 22 show exemplary circuits to which the Boosted NFET is applied. The portions enclosed by broken lines are the Boosted NFET.

Figure 19:
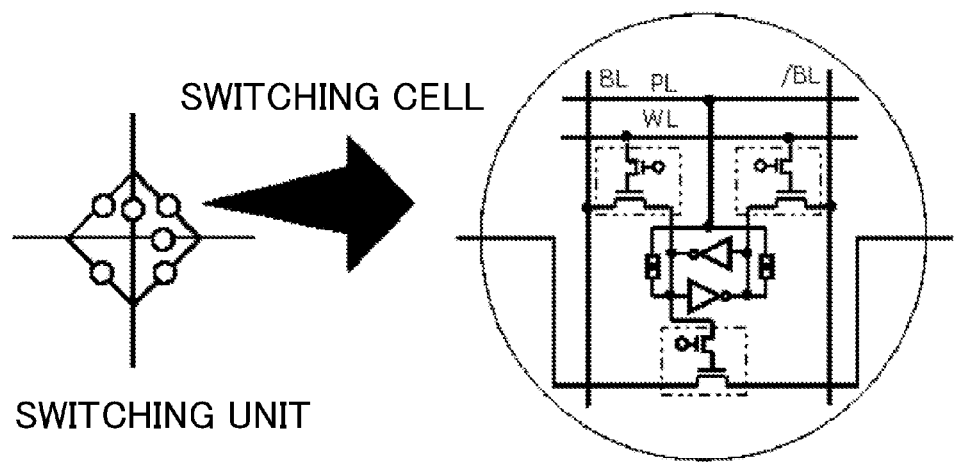
FIG. 19 is a circuit diagram showing an exemplary application of the memory circuit according to the embodiment in which the memory circuit is applied to an FPGA crossbar switch.

The circuit shown in FIG. 19 shows a case in which the Boosted NFET is used as a part of the crossbar switch of a nonvolatile FPGA. With such a configuration, the MTJ can be used as the memory cell of a nonvolatile FPGA.

Figure 20:
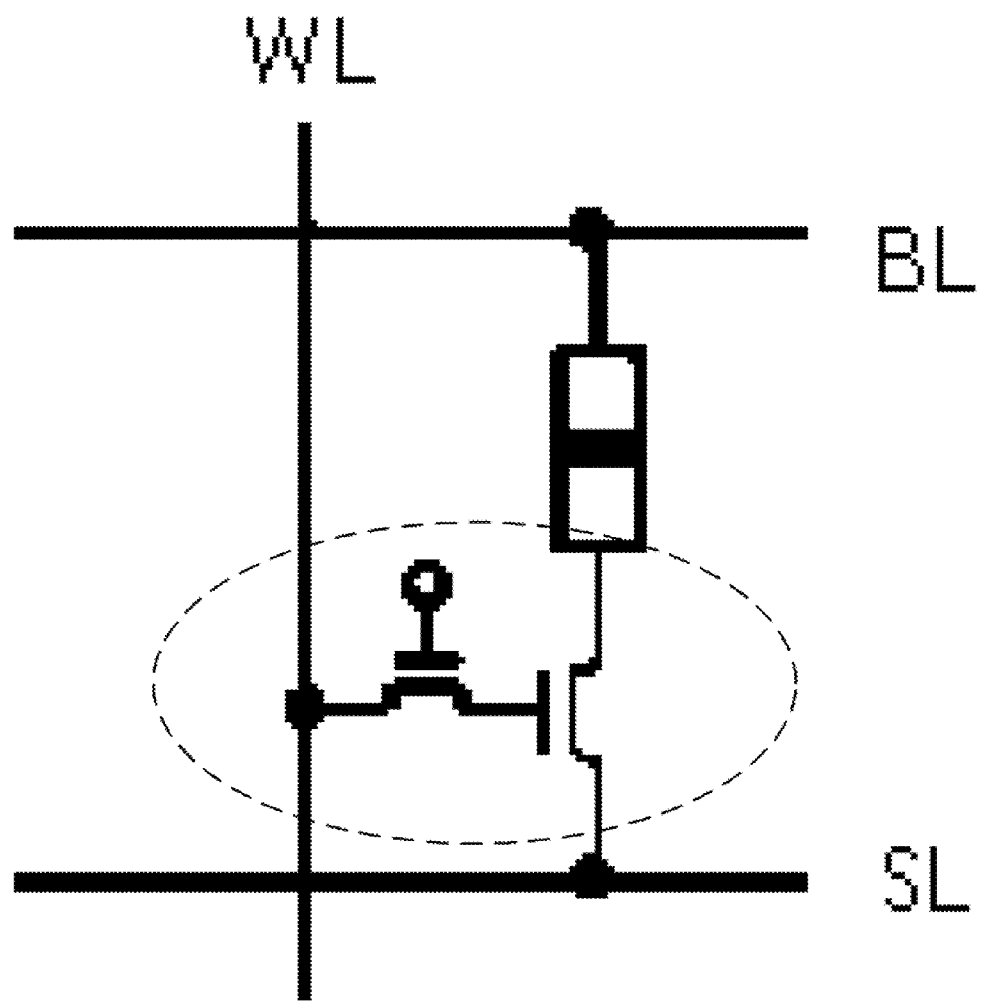
FIG. 20 is a circuit diagram showing an exemplary application of the memory circuit according to the embodiment.

In the circuit shown in FIG. 20, the free layer of the MTJ and a bit line BL are connected, one terminal of the MOSFET that is connected to the pin layer of the MTJ and a source line SL are connected, and one terminal of the MOSFET that is not directly connected to the MTJ and a word like WL are connected. The MTJ is selected by the word line WL, the stored data are read from the resistance value between the bit line BL and source line SL, and the voltage applied between the bit line BL and source line SL is adjusted, whereby the current flowing through the MTJ is controlled to write data.

Figure 21:
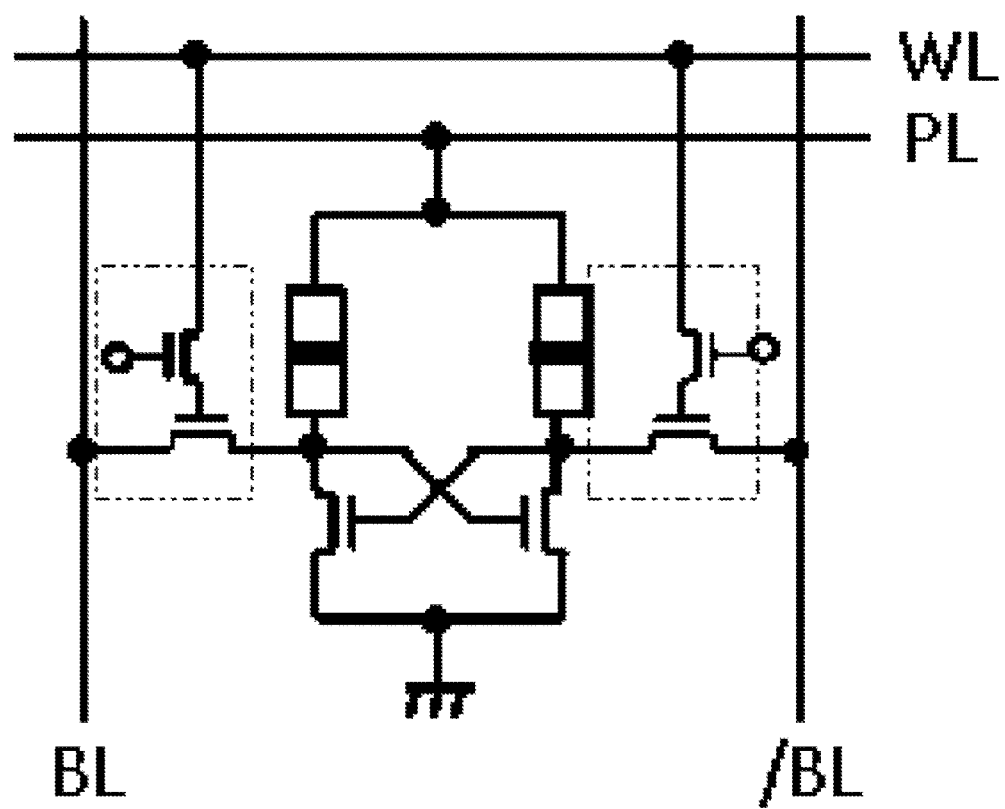
FIG. 21 is a circuit diagram showing an exemplary application of the memory circuit according to the embodiment.

The circuit shown in FIG. 21 has two inverters each comprising a single MTJ and a single MOSFET driving the MTJ with the Boosted NFETs provided one each between the output terminal of either inverter and a bit line (or a bit line bar) BL, /BL.

Figure 22:
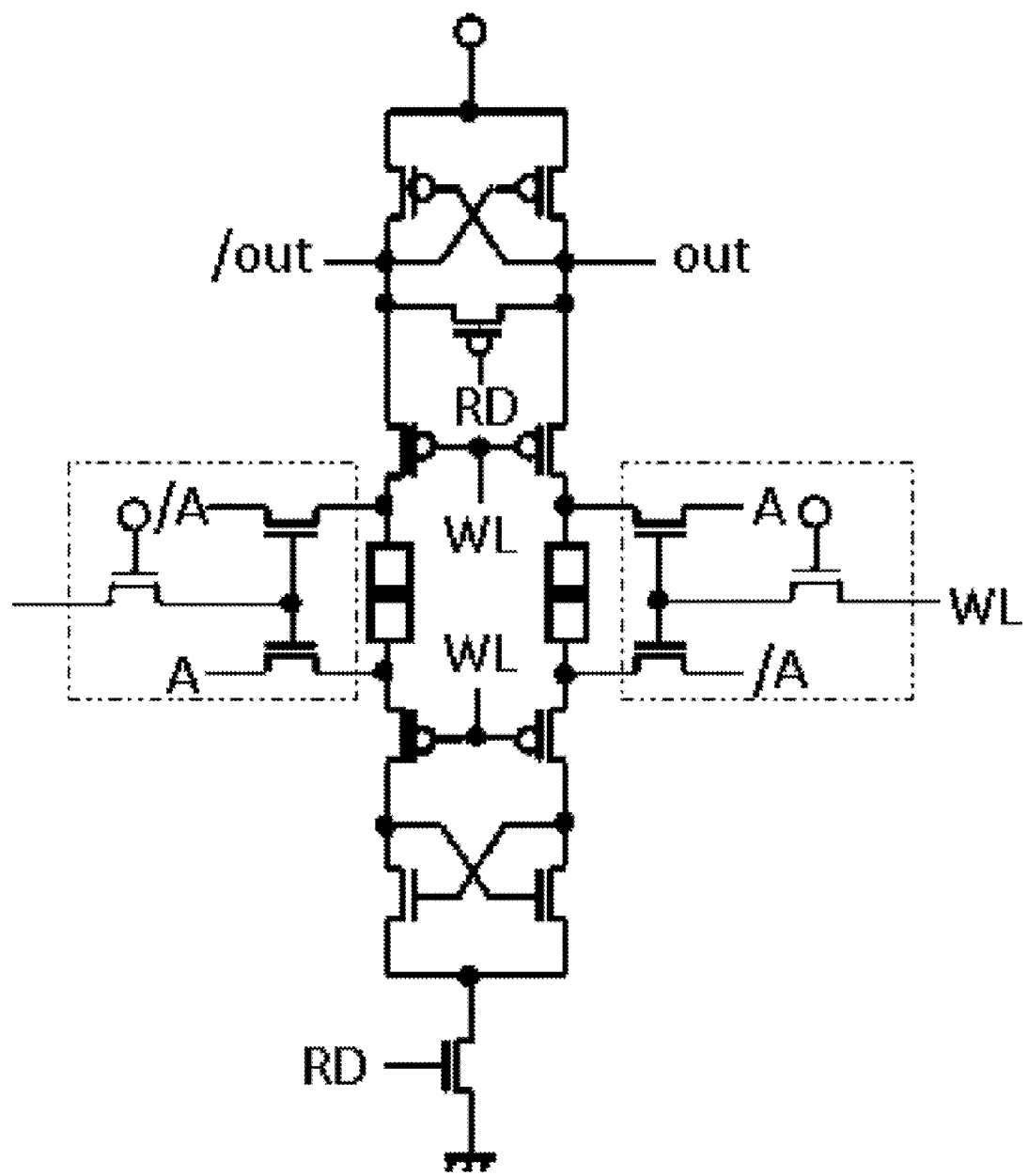
FIG. 22 is a circuit diagram showing an exemplary application of the memory circuit according to the embodiment.
Figure 23:
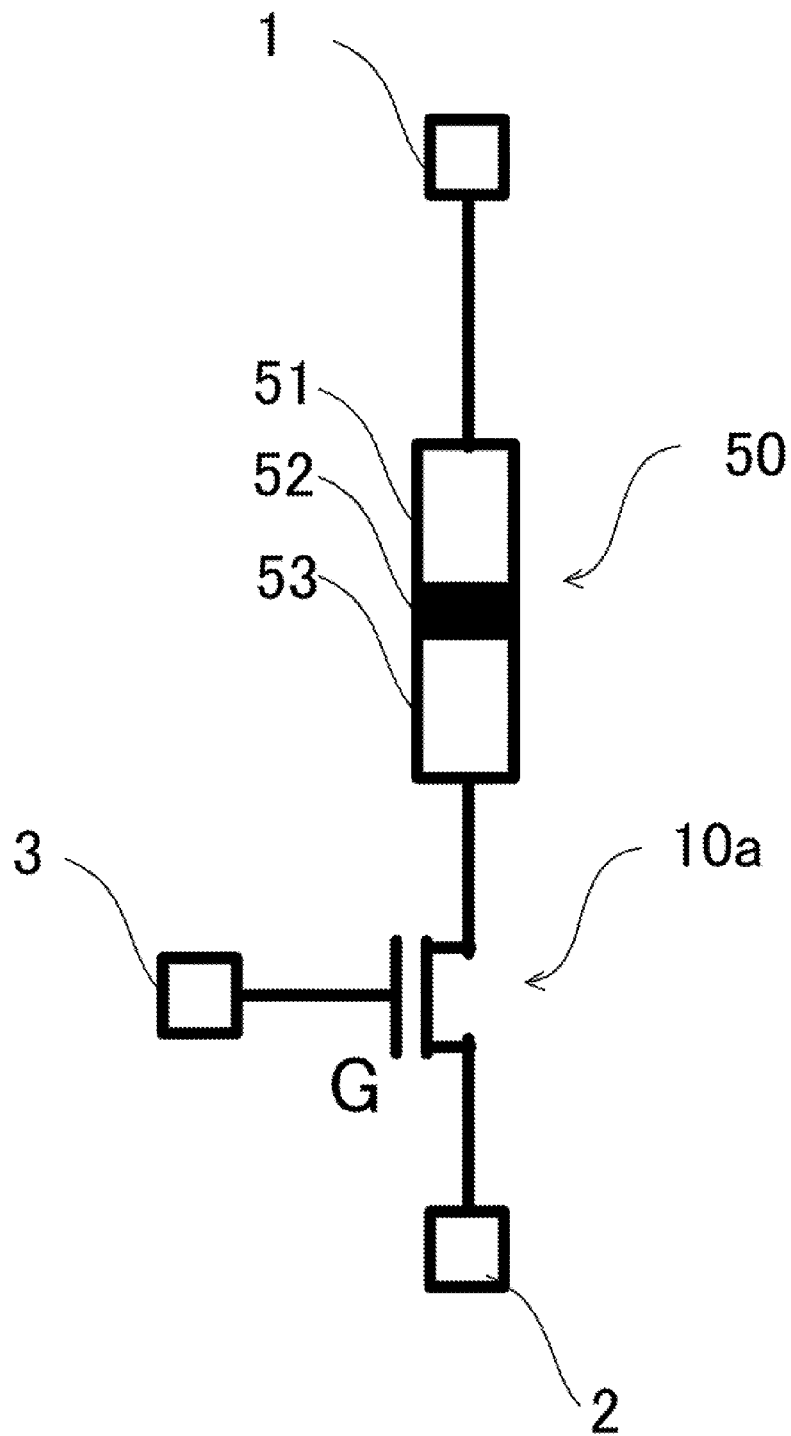
FIG. 23 is a diagram showing the circuit configuration when the selection device is an N-type MOSFET.
Figure 24:
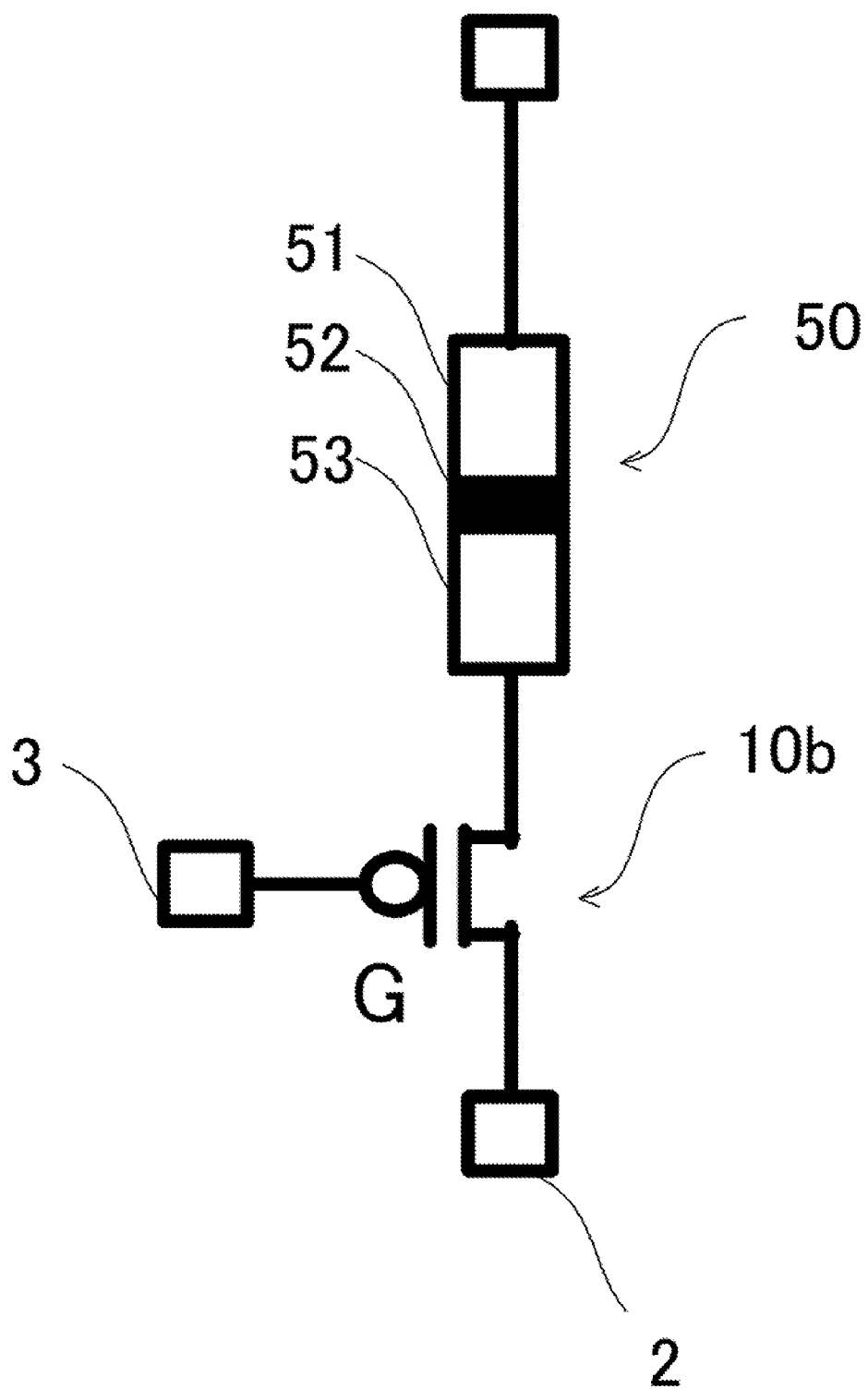
FIG. 24 is a diagram showing the circuit configuration when the selection device is a P-type MOSFET.

FIG. 22 shows a case in which the Boosted NFET is used in a nonvolatile latch circuit.

Here, the circuits shown in FIGS. 19 to 22 are all functionally connected to the portions working as the selection circuit 102 and read/write circuit 101 exemplified in FIG. 5.

As described above, the mode of implementation can provide a compact selection device capable of flowing a sufficient writing current through an MTJ element and requiring a small occupancy area, which can be used as a selection device of the technology nodes of 90 nm and smaller.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The present application is based on Japanese Patent Application No. 2013-196202, filed on Sep. 20, 2013, of which the specification, scope of claims, and drawings are entirely incorporated herein by reference.

INDUSTRIAL APPLICABILITY

The preset disclosure is applicable to memory circuits using magnetic tunnel junction elements.

REFERENCE SIGNS LIST 10, 110 Selection device
10a N-type MOSFET
10b P-type MOSFET
11, 12 N-type MOSFET
50 MTJ element
51 Free layer
51a Electrode
52 Insulation layer
53 Pin layer
53a Electrode
70a, 70b, 70c, Control terminal
100, 200 Memory circuit
111, 112 P-type MOSFET

The invention claimed is:

1. A memory circuit, comprising:
a magnetic tunnel junction element, a first field-effect transistor, and a second field-effect transistor,
wherein one end of a current path of the second field-effect transistor is connected to a gate of the first field-effect transistor, one end of the magnetic tunnel junction element is connected to one end of a current path of the first field-effect transistor, a first control terminal is connected to another end of the current path of the first field-effect transistor, a second control terminal is connected to another end of the magnetic tunnel junction element, and a third control terminal is connected to another end of the current path of the second field-effect transistor, a fixed voltage being applied to a gate of the second field-effect transistor, the fixed voltage being a power supply voltage or a ground potential level voltage, wherein the power supply voltage is fixed between 0.8 volts and 1.2 volts, and
when a first voltage is applied to the first control terminal, a second voltage is applied to the second control terminal, and a third voltage is applied to the third control terminal, respectively, a current flows through the current path of the first field-effect transistor in a direction corresponding to the magnitude relation between the first voltage applied to the first control terminal and the second voltage applied to the second control terminal,
wherein the first field-effect transistor and second field-effect transistor each comprise an N-type MOSFET or a P-type MOSFET, and
the fixed voltage is a power supply voltage when the first and second field-effect transistors comprise the N-type MOSFETs, and the fixed voltage is the ground potential level voltage when the first and second field-effect transistors comprise the P-type MOSFETs.

2. The memory circuit according to claim 1, comprising:
a selection circuit connected to the third control terminal; and
a read/write circuit connected to the first control terminal and the second control terminal;
wherein the power supply voltage or the ground potential level voltage is applied to the gate of the second field-effect transistor,
at a time of data writing in the magnetic tunnel junction element, the selection circuit applies the power supply voltage or ground potential level voltage to the third control terminal and the read/write circuit applies a voltage for flowing a writing current between the first control terminal and the second control terminal so as to set the magnetic tunnel junction element to either one of a low resistance state and a high resistance state, and
at a time of data reading from the magnetic tunnel junction element, the selection circuit applies the power supply voltage or ground potential level voltage to the third control terminal and the read/write circuit directly or indirectly measures a resistance between the first control terminal and the second control terminal.

3. The memory circuit according to claim 2, wherein
the selection circuit applies the power supply voltage or ground potential level voltage to the third control terminal and subsequently the read/write circuit applies a voltage between the first control terminal and the second control terminal so as to cut off the second field-effect transistor.

4. The memory circuit according to claim 3, wherein
the selection circuit applies the ground potential level voltage to the third control terminal and the read/write circuit applies the ground potential level voltage to the first control terminal and the second control terminal,
at a time of data writing into the magnetic tunnel junction element, the selection circuit applies the power supply voltage or ground potential level voltage to the third control terminal, and subsequently the read/write circuit applies the power supply voltage to one of the first control terminal and the second control terminal while maintaining applying of the ground potential level voltage to another of first and second control terminal.

5. A memory circuit comprising:
a magnetic tunnel junction element, a first field-effect transistor, and a second field-effect transistor,
wherein one end of a current path of the second field-effect transistor is connected to a gate of the first field-effect transistor, one end of the magnetic tunnel junction element is connected to one end of a current path of the first field-effect transistor, a first control terminal is connected to another end of the current path of the first field-effect transistor, a second control terminal is connected to another end of the magnetic tunnel junction element, and a third control terminal is connected to another end of the current path of the second field-effect transistor, a fixed voltage is applied to a gate of the second field-effect transistor, the fixed voltage is a power supply voltage or a ground potential level voltage, and
when a first voltage is applied to the first control terminal, a second voltage is applied to the second control terminal, and a third voltage is applied to the third control terminal, respectively, a current flows through the current path of the first field-effect transistor in a direction corresponding to the magnitude relation between the first voltage applied to the first control terminal and the second voltage applied to the second control terminal, and the power supply voltage is 1.05V or lower.

6. A memory circuit comprising:
a magnetic tunnel junction element, a first field-effect transistor, and a second field-effect transistor,
wherein one end of a current path of the second field-effect transistor is connected to a gate of the first field-effect transistor, one end of the magnetic tunnel junction element is connected to one end of a current path of the first field-effect transistor, a first control terminal is connected to another end of the current path of the first field-effect transistor, a second control terminal is connected to another end of the magnetic tunnel junction element, and a third control terminal is connected to another end of the current path of the second field-effect transistor, a fixed voltage is applied to a gate of the second field-effect transistor, the fixed voltage is a power supply voltage or a ground potential level voltage, and
when a first voltage is applied to the first control terminal, a second voltage is applied to the second control terminal, and a third voltage as applied to the third control terminal, respectively, the current path of the first field-effect transistor reaches a state in which a specific current flows in a direction corresponding to the magnitude relation between the first voltage applied to the first control terminal and the second voltage applied to the second control terminal, and wherein
a ratio between a channel width of the first field-effect transistor and a diameter of the magnetic tunnel junction element (Wn1/MTJφ) and a ratio between the channel width of the first field-effect transistor and a channel width of the second field-effect transistor (Wn1/Wn2) satisfy the following expression:

$$4 \leq Wn1/MTJ\varphi \leq 15, \ 2 \leq Wn1/Wn2 \leq 5.$$

7. A memory circuit comprising:
a magnetic tunnel junction element, a first field-effect transistor, and a second field-effect transistor,
wherein one end of a current path of the second field-effect transistor is connected to a gate of the first field-effect transistor, one end of the magnetic tunnel junction element is connected to one end of a current path of the first field-effect transistor, a first control terminal is connected to another end of the current path of the first field-effect transistor, a second control terminal is connected to another end of the magnetic tunnel junction element, and a third control terminal is connected to another end of the current path of the second field-effect transistor, a fixed voltage is applied to a gate of the second field-effect transistor, the fixed voltage is a power supply voltage or a ground potential level voltage, and
when a first voltage is applied to the first control terminal, a second voltage is applied to the second control terminal, and a third voltage as applied to the third control terminal, respectively, the current path of the first field-effect transistor reaches a state in which a specific current flows in a direction corresponding to the magnitude relation between the first voltage applied to the first control terminal and the second voltage applied to the second control terminal,
wherein
a channel width of the second field-effect transistor is smaller than a channel width of the first field-effect transistor.

8. A memory circuit comprising:
a magnetic tunnel junction element, a first field-effect transistor, and a second field-effect transistor,
wherein one end of a current path of the second field-effect transistor is connected to a gate of the first field-effect transistor, one end of the magnetic tunnel junction element is connected to one end of a current path of the first field-effect transistor, a first control terminal is connected to another end of the current path of the first field-effect transistor, a second control terminal is connected to another end of the magnetic tunnel junction element, and a third control terminal is connected to another end of the current path of the second field-effect transistor, a fixed voltage is applied to a gate of the second field-effect transistor, the fixed voltage is a power supply voltage or a ground potential level voltage, and
when a first voltage is applied to the first control terminal, a second voltage is applied to the second control terminal, and a third voltage as applied to the third control terminal, respectively, the current path of the first field-effect transistor reaches a state in which a specific current flows in a direction corresponding to the magnitude relation between the first voltage applied to the first control terminal and the second voltage applied to the second control terminal, wherein
the first field-effect transistor and second field-effect transistor each comprise an N-type MOSFET, and
the fixed voltage is the power supply voltage,
the selection circuit applies the ground potential level voltage to the third control terminal, and the read/write circuit applies the ground potential level voltage to the first control terminal and the second control terminal,
at a time of data writing into the magnetic tunnel junction element, the selection circuit applies the power supply voltage to the third control terminal, and subsequently the read/write circuit applies the power supply voltage to one of the first control terminal and the second control terminal while maintaining applying of the ground potential level voltage to another of first and second control terminal.

9. A memory circuit comprising:
a magnetic tunnel junction element, a first field-effect transistor, and a second field-effect transistor,
wherein one end of a current path of the second field-effect transistor is connected to a gate of the first field-effect transistor, one end of the magnetic tunnel junction element is connected to one end of a current path of the first field-effect transistor, a first control terminal is connected to another end of the current path of the first field-effect transistor, a second control terminal is connected to another end of the magnetic tunnel junction element, and a third control terminal is connected to another end of the current path of the second field-effect transistor, a fixed voltage is applied to a gate of the second field-effect transistor, the fixed voltage is a power supply voltage or a ground potential level voltage, and
when a first voltage is applied to the first control terminal, a second voltage is applied to the second control terminal, and a third voltage as applied to the third control terminal, respectively, the current path of the first field-effect transistor reaches a state in which a specific current flows in a direction corresponding to the magnitude relation between the first voltage applied to the first control terminal and the second voltage applied to the second control terminal,
wherein the first field-effect transistor and second field-effect transistor each comprise a P-type MOSFET, and
the fixed voltage is the ground potential level voltage,
the selection circuit applies the power supply voltage to the third control terminal, and the read/write circuit applies the power supply voltage to the first control terminal and the second control terminal,
at a time of data writing into the magnetic tunnel junction element, the selection circuit applies the ground potential level voltage to the third control terminal, and subsequently the read/write circuit applies the ground potential level voltage to one of the first control terminal and the second control terminal while maintaining applying of the power supply voltage to another of first and second control terminal.

* * * * *